(12) United States Patent
Gorbachov

(10) Patent No.: US 10,566,946 B2
(45) Date of Patent: *Feb. 18, 2020

(54) QUASI-DIFFERENTIAL RF POWER AMPLIFIER WITH HIGH LEVEL OF HARMONICS REJECTION

(71) Applicant: SKYWORKS SOLUTIONS, INC., Woburn, MA (US)

(72) Inventor: Oleksandr Gorbachov, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/828,162

(22) Filed: Nov. 30, 2017

(65) Prior Publication Data
US 2018/0091114 A1    Mar. 29, 2018

Related U.S. Application Data

(63) Continuation of application No. 14/539,032, filed on Nov. 12, 2014, now Pat. No. 9,866,196.
(Continued)

(51) Int. Cl.
| | | |
|---|---|---|
| H03F 3/04 | (2006.01) | |
| H03H 7/42 | (2006.01) | |
| H03F 3/19 | (2006.01) | |
| H03F 1/56 | (2006.01) | |
| H03F 3/195 | (2006.01) | |
| H03F 3/21 | (2006.01) | |
| H03F 3/24 | (2006.01) | |
| H03F 3/191 | (2006.01) | |

(52) U.S. Cl.
CPC ............... *H03H 7/42* (2013.01); *H03F 1/565* (2013.01); *H03F 3/19* (2013.01); *H03F 3/191* (2013.01); *H03F 3/195* (2013.01); *H03F 3/211* (2013.01); *H03F 3/245* (2013.01); *H03F 2200/09* (2013.01); *H03F 2200/318* (2013.01); *H03F 2200/387* (2013.01); *H03F 2200/451* (2013.01)

(58) Field of Classification Search
CPC .................................. H03H 7/42; H03F 1/565
USPC ............................... 330/301, 295.124 R, 275
See application file for complete search history.

(56) References Cited

U.S. PATENT DOCUMENTS

| | | | | |
|---|---|---|---|---|
| 5,477,188 A | * | 12/1995 | Chawla | ................... H03F 1/301 330/269 |
| 2002/0067211 A1 | * | 6/2002 | Matsuyoshi | .......... H03F 1/3205 330/301 |

(Continued)

*Primary Examiner* — Khanh V Nguyen
*Assistant Examiner* — Khiem D Nguyen
(74) *Attorney, Agent, or Firm* — Stetina Brunda Garred & Brucker

(57) ABSTRACT

A quasi-differential amplifier with an input port and an output port. The amplifier has a phase shifter network with a first port connected to the input port, a second port, and a third port. A first amplifier has an input connected to the second port of the phase shifter network, and an output, and a second amplifier has an input connected to the third port of the phase shifter network, and an output. A balun circuit includes a first differential port connected to an output of the first amplifier, a second differential port connected to an output of the second amplifier, and a single-ended port. An output matching network is connected to the single-ended port of the balun circuit and to the output port.

21 Claims, 28 Drawing Sheets

Related U.S. Application Data

(60) Provisional application No. 61/903,506, filed on Nov. 13, 2013.

(56) References Cited

U.S. PATENT DOCUMENTS

| | | | |
|---|---|---|---|
| 2004/0052536 A1* | 3/2004 | Zhou | H04B 10/504 398/193 |
| 2014/0043108 A1* | 2/2014 | Tanaka | H03H 7/42 333/26 |

* cited by examiner

Amplifier Emitter Bond Wire Inductance Variation -10%

Amplifier Emitter Bond Wire Inductance Variation - Nominal

Amplifier Emitter Bond Wire Inductance Variation +10%

Input Signal Phase Imbalance Variation -/+10 Degrees

Input Signal Phase Imbalance Variation - Nominal (180 Degrees)

Input Signal Phase Imbalance Variation +/- 10 Degrees

Input Signal Phase Imbalance Variation -/+30 Degrees

Input Signal Phase Imbalance Variation - Nominal (180 Degrees)

Input Signal Phase Imbalance Variation +/- 30 Degrees

Input Signal Amplitude Imbalance Variation -/+ 0.5dB

Input Signal Amplitude Imbalance Variation - Nominal (0 dB)

Input Signal Amplitude Imbalance Variation +/- 0.5 dB

Input Signal Amplitude Imbalance Variation -/+ 1.5dB

Input Signal Amplitude Imbalance Variation - Nominal (0 dB)

Input Signal Amplitude Imbalance Variation +/- 1.5 dB

Base Voltage Amplitude Imbalance Variation -/+ 1.5dB

Base Voltage Amplitude Imbalance Variation - Nominal (0 dB)

Base Voltage Amplitude Imbalance Variation +/- 1.5 dB

Base Voltage Phase Imbalance Variation -/+ 30 degrees

Base Voltage Phase Imbalance Variation - Nominal (180 Degrees)

Base Voltage Phase Imbalance Variation +/- 30 degrees

Collector Inductor Variation First 0.3 nH. Second 0.1 nH

Collector Inductor Variation - Both 0.1 nH

Collector Inductor Variation First 0.1 nH, Second 0.3 nH

Base Inductor Variation - First 0.45 nH, Second 0.25 nH

Base Inductor Variation - Both 0.25 nH

Base Inductor Variation First 0.25 nH, Second 0.45 nH

First Balun Extension Inductor – 0.15 nH

Balun Extension Inductors – Both 0 nH

Second Balun Extension Inductor – 0.15 nH

QUASI-DIFFERENTIAL RF POWER AMPLIFIER WITH HIGH LEVEL OF HARMONICS REJECTION

CROSS-REFERENCE TO RELATED APPLICATIONS

This application is a continuation patent application of U.S. patent application Ser. No. 14/539,032 filed Nov. 12, 2014 and entitled "QUASI-DIFFERENTIAL RF POWER AMPLIFIER WITH HIGH LEVEL OF HARMONICS REJECTION," which relates to and claims the benefit of U.S. Provisional Application No. 61/903,506, filed Nov. 13, 2013 and entitled "QUASI-DIFFERENTIAL RF POWER AMPLIFIER WITH HIGH LEVEL OF HARMONICS REJECTION," the entirety of the disclosure of which is wholly incorporated by reference herein.

STATEMENT RE: FEDERALLY SPONSORED RESEARCH/DEVELOPMENT

Not Applicable

BACKGROUND

1. Technical Field

The present disclosure generally relates to radio frequency (RF) circuit components, and more particularly, the quasi-differential RF power amplifiers with a high level of harmonics rejection.

2. Related Art

An RF communications system is generally comprised of a transmitter that generates signals that are radiated as radio frequency electromagnetic waves by an antenna, and a receiver that converts the electromagnetic waves generated by a counterpart remote transmitter and detected by the antenna to usable signal. Due to the transmitter circuitry lacking sufficient output power, the transmitter is typically connected to additional components that are dedicated to amplifying the generated signal, referred to as power amplifiers. Similarly, because the receiver circuitry typically lacks sufficient reception sensitivity, there are additional components also dedicated to amplifying the received signal, referred to as low noise amplifiers.

Certain limitations in amplifier circuits/transistors dictate the use of multiple transistors with outputs thereof being connected to a single load (antenna). There are also circumstances where signals multiple antennas are amplified by a single amplifier circuit. Both of these applications involve a power combiner, and there are a variety of modalities thereof that are known in the art.

One such modality is in-phase power combining, where multiple signals of identical phase and amplitude are combined into a single output, typically at the final stage before connecting to the antenna. There are deficiencies, however, relating to the load voltage standing wave ratio (VSWR) variation being equally applied to different transistors, thus limiting applicability. In particular, high voltage swings across different transistor nodes may become unacceptably high.

Another modality known in the art is quadrature combining. In one variation, identical balanced power amplifiers are connected to input quadrature directional coupler as well as an output quadrature directional coupler in the reverse. Although load VSWR variation has a small influence on the reliability of the transistors, current consumption is fairly high, and an additional harmonics rejection filter is needed in order to pass regulatory requirements. Such harmonics filtering is needed for in-phase power combining circuits as well.

Yet another modality is out-of-phase power combining, where differential signals are equally amplified and combined at an output balun. This technique is understood to relax voltage swing requirements for each transistor in the circuit. Additionally, reliability is improved, and adequate levels of even harmonics rejection can be realized. Existing out-of-phase power combining circuitry, however, are still deficient with respect to odd harmonics rejection at the circuit output. Moreover, optimal performance demands a symmetrical layout or routing of the differential circuit is necessary, along with fabrication on an appropriate semiconductor or other laminate substrate. In order to achieve an adequate level of even harmonics rejection, the input signal imbalance must be kept to a minimal level.

Accordingly, there is a need in the art for an improved out-of-phase power combining modality that addresses the aforementioned limitations of existing implementations. There is also a need for quasi-differential RF power amplifier with a high level of both even and odd harmonics rejection.

BRIEF SUMMARY

The present disclosure is directed to out-of-phase power combining with non-symmetrical balun circuitry. A high level of even and odd harmonics rejection is contemplated, and variations in component values and input signal imbalances will have little influence over circuit performance, particularly as relating to the robustness to load VSWR variations. The disclosed quasi-differential RF power amplifier is suited for either linear or non-linear operation, and implemented in an integrated circuit along with other RF transceiver/front end circuit components.

In accordance with one embodiment of the present disclosure, there is a balun circuit. The balun circuit may include a single-ended port, a first differential port, and a second differential port. There may also be a pair of first and second coupled inductors. The first coupled inductor may be electrically connected to the first differential port and the single-ended port. The second coupled inductor may be electrically connected to the second differential port. The balun circuit may also have a first capacitor that is electrically connected to the first coupled inductor and the second coupled inductor. Additionally, the balun circuit may have a second capacitor that is electrically connected to the second coupled inductor. There may be a grounded inductor electrically coupled in series to the second capacitor. A differential signal fed to the first differential port and the second differential port can be converted to a single signal output from the single-ended port. A common output impedance of the single-ended port may be transformed from an input impedance of the first and second differential ports.

Another embodiment of the present disclosure is directed to quasi-differential amplifier. The amplifier may include an input port and an output port. There may be a phase shifter network that has a first port connected to the input port, a second port, and a third port. Furthermore, there may be a first amplifier with an input connected to the second port of the phase shifter network, and an output, as well as a second amplifier with an input connected to the third port of the phase shifter network, and an output. The quasi-differential amplifier may include a balun circuit with a first differential port connected to an output of the first amplifier, a second differential port connected to an output of the second amplifier, and a single-ended port. The amplifier may further incorporate an output matching network that can be connected to the single-ended port of the balun circuit and to the output port.

The balun circuit and the quasi-differential amplifier will be best understood by reference to the following detailed description when read in conjunction with the accompanying drawings

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The present disclosure encompasses various embodiments of radio frequency (RF) power amplifiers. The detailed description set forth below in connection with the appended drawings is intended as a description of the several presently contemplated embodiments of these circuits, and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1A:
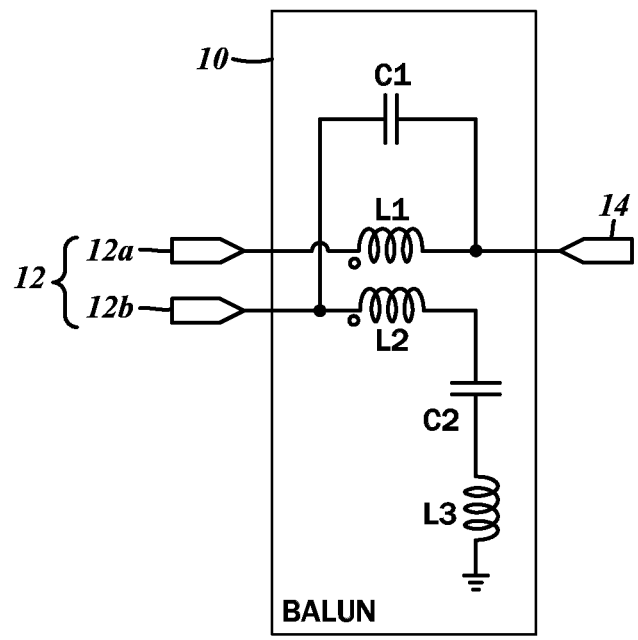
FIG. 1A is a schematic diagram of a balun circuit in accordance with one embodiment of the present disclosure.

FIG. 1A illustrates one embodiment of a balun circuit 10 that may be utilized in connection with the quasi-differential RF power amplifier of the present disclosure. The balun circuit 10 is generally defined by differential ports 12, including a first differential port 12a and a second differential port 12b, as well as a single-ended port 14. Additionally, there is a pair of coupled inductors including a first inductor L1 and a second inductor L2. A first node of the first inductor L1 is electrically connected to the first differential port 12a, while a second node of the first inductor L1 is electrically connected to the single-ended port 14. A first node of the second inductor L2 is electrically connected to the second differential port 12b. A grounded inductor L3 is connected in series with a capacitor C2, which is also electrically connected to the second node of the second inductor L2. There is a capacitor C1 connected to the first node of the second inductor L2 as well as the second differential port 12b, and the second node of the first inductor L1 as well as the single-ended port 14. The specific values of the aforementioned components may be selected to correspond to the performance characteristics described in further detail below.

The balun circuit 10 is understood to convert a differential signal applied to the differential ports 12 to an output on the single-ended port 14. Additionally, the balun circuit 10 transforms the input impedance at the differential ports 12 to a different output impedance at the single-ended port 14. The single-ended impedance at one differential port 12 may differ from the single-ended impedance at another port.

Figure 1B:
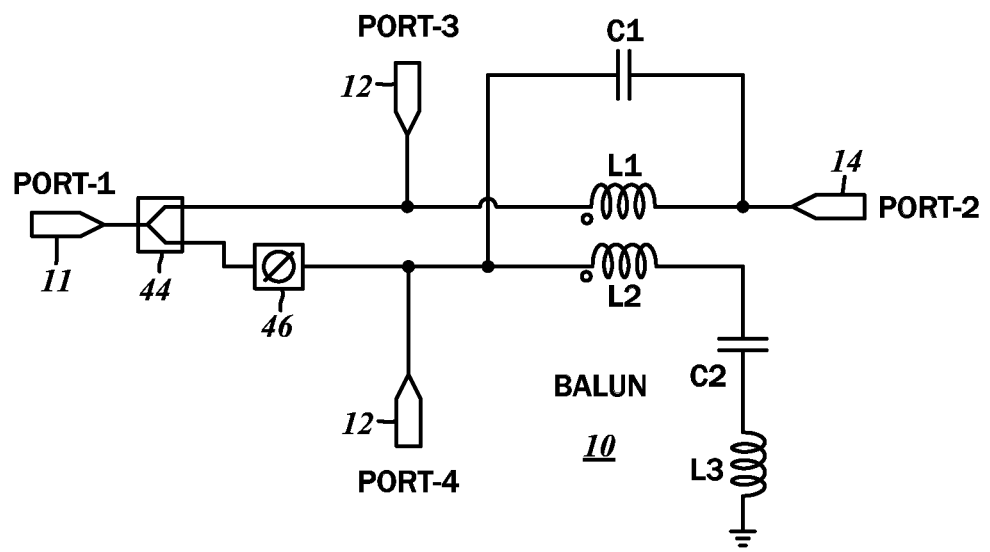
FIG. 1B is a schematic diagram of the balun circuit depicted in FIG. 1A in a testing configuration.
Figure 2:
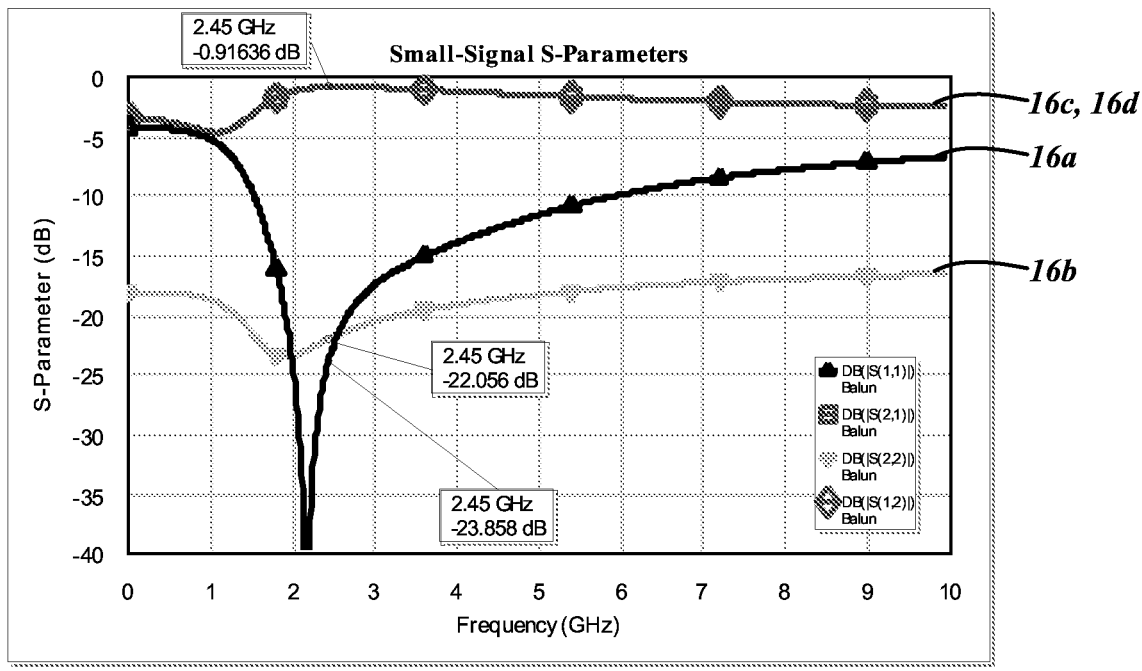
FIG. 2 is a graph showing the scattering parameters (S-parameters) of the balun circuit shown in FIG. 1A as evaluated under a simulated test configuration shown in FIG. 1B over an operating frequency range, with the balanced port input return loss and output return loss being detailed.

The graph of FIG. 2 shows the scattering parameters (S-parameters) of the balun circuit 10 as illustrated in an exemplary simulated test configuration presented in FIG. 1B. More particularly, there is a single-ended port 11 that is connected to a 3 dB power splitter 44. There are two split ports, one of which is connected to the first differential port 12a, and the other being connected to a 180 degree phase shifter 46 that is in turn connected to the second differential port 12b. Reference to Port-1 in the following graphs and charts is understood to refer to the single-ended port 11, while Port-2 refers to the single-ended port 14.

Figure 3:
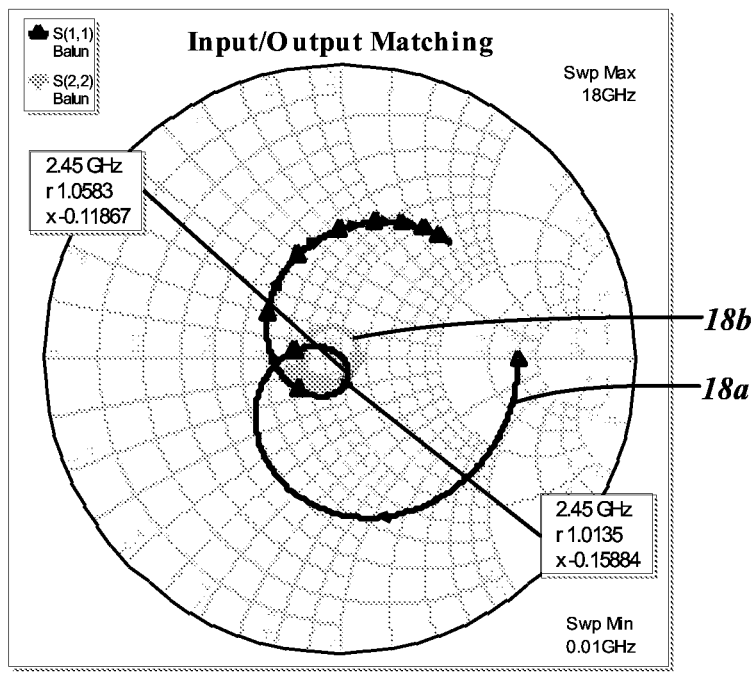
FIG. 3 is a Smith chart showing the input and output return loss of the balanced ports and the output port of the balun circuit shown in FIG. 1A as evaluated under a simulated test configuration shown in FIG. 1B.

A first plot 16a is of the input return loss for the input, $S_{11}$, while a second plot 16b is of the output return loss for the output, $S_{22}$. Additionally, a third plot 16c and a fourth plot 16d are of the insertion loss between the input port and the output port. Additionally, the Smith chart of FIG. 3 plots the input and output return losses of the balun circuit 10 as shown in the simulated test configuration of FIG. 1B. $S_{11}$ and $S_{22}$ as a first plot 18a and a second plot 18b, respectively. As shown, at an example center operating frequency of 2.45 GHz (corresponding to the 2 GHz Industrial-Scientific-Medical/ISM band), the balun circuit 10 exhibits good matching characteristics with the input differential impedance at the differential ports 12 chosen at 14 ohm, and the output impedance at the single-ended port 14 chosen at 10 ohm. More particularly, each of the first and second differential ports 12a, 12b may be loaded by a single-ended transistor stage at 7 ohm, and transformed to a 10 ohm common load. There is understood to be some signal loss associated with the balun circuit 10, though with the remaining transformation to a 50 ohm load being from 10 ohm, it is with fewer losses.

The input signals to the differential ports 12 preferably meet certain characteristics. The phase imbalance of the input voltage, as well as of the input current, is preferably tuned to be as low as possible. In one embodiment, the phase imbalance is less than five (5) degrees. Additionally, although the voltage and current levels at each of the differential ports 12 need not be equal, though the total power level delivered by the input signal should be as close to each other as possible. Preferably, the difference in power level at each of the differential ports 12 is less than 10%.

Figure 4:
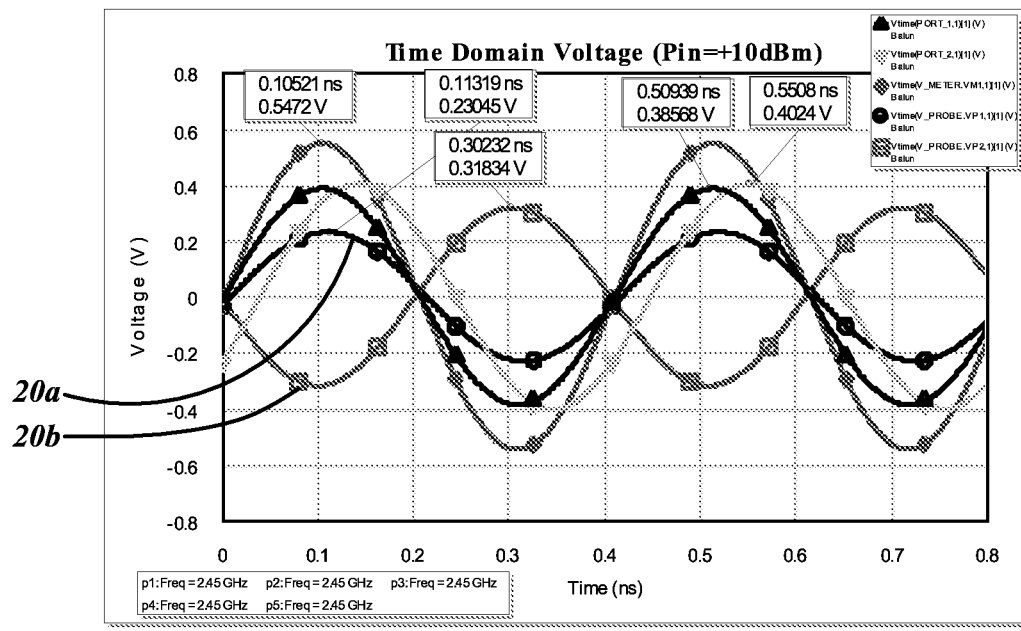
FIG. 4 is a graph of simulated time domain voltage waveforms at the various nodes of the balun circuit shown in FIG. 1A as evaluated under a simulated test configuration shown in FIG. 1B.
Figure 5:
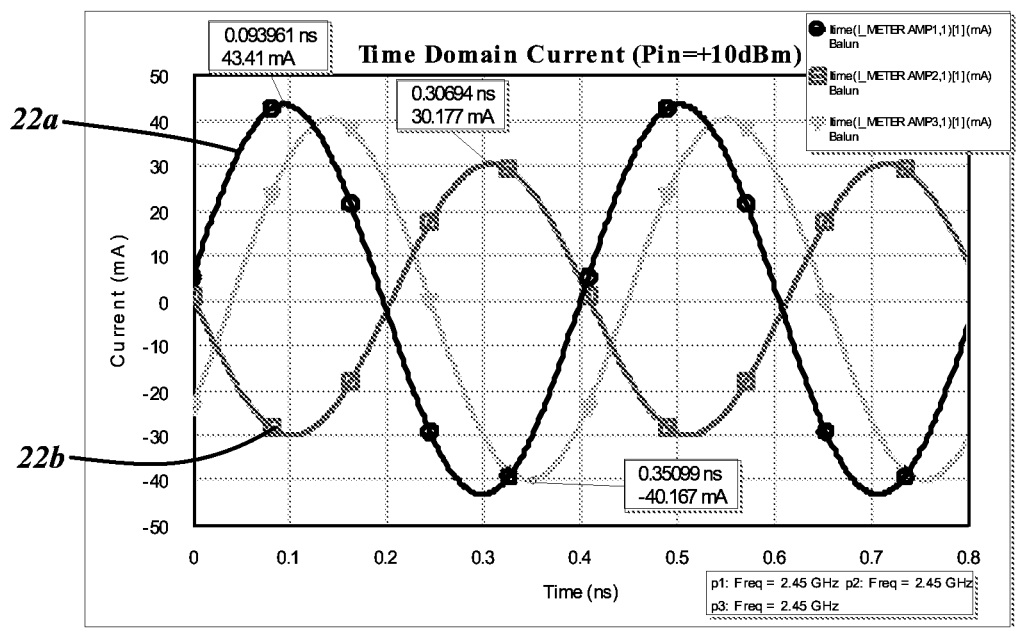
FIG. 5 is a graph of simulated time domain current waveforms at the various nodes of the balun circuit shown in FIG. 1A as evaluated under a simulated test configuration shown in FIG. 1B.

The graphs of FIG. 4 and FIG. 5 plot the time-domain voltage and current waveforms, respectively, at the various nodes of the balun circuit 10 as evaluated under a simulated test configuration shown in FIG. 1B given a fixed frequency and input power. In the example illustrated, the frequency is 2.45 GHz, while the input power is +10 dBm. The graph of FIG. 4 includes a first plot 20a of the voltage signal at the first differential port 12a, and a second plot 20b of the voltage signal at the second differential port 12b. Similarly, the graph of FIG. 5 includes a first plot 22a of the current signal at the first differential port 12a, and a second plot 22b of the current signal at the second differential port 12b. As illustrated, between the first differential port 12a and the second differential port 12b, there is a substantial voltage amplitude imbalance of approximately 1.36: peak voltage of 0.31834 V for the second differential port 12b, over a peak voltage of 0.23045 V for the first differential port 12a. There is also a substantial current amplitude imbalance of approximately 1.4385: peak current of 43.41 mA at the first differential port 12a, and a peak current of 30.177 mA at the second differential port 12b. The imbalance in phase is relatively minimal.

While the amplitude imbalance with respect to voltage and current are high, the input power imbalance is not. For example, the power at the first differential port 12a, given by $V_{max}*I_{max}/2$, or 0.23045 V*43.41 mA/2, is 5.002 mW. Further, the power at the second differential port 12b, e.g., 0.31834 V*30.177 mA/2, is 4.803 mW. The total power at the differential port 12, e.g., 5.002 mW+4.8033 mW, is 9.805 mW or 9.914 dBm. Accordingly, given an input power of 10 dBm, this amounts to less than 0.1 dBm of input power loss. This is understood to be attributable to the small impedance mismatch of the balun circuit 10.

In accordance with various embodiments as will be described in further detail below, the balun circuit 10 can be utilized with differential amplifiers for combining signals. With reference to the schematic diagram of FIG. 6, the balun circuit 10 is incorporated into a quasi-differential amplifier circuit 24 in accordance with one embodiment of the present disclosure. Generally, the circuit 24 includes an RF input port 26 that receives an input signal from, for example, a transmitter. In some configurations, the transmitter may have differential ports. If the transmitter has a single-ended port, the 3 dB power splitter and 180 degree phase shifter is utilized in accordance with various embodiments of the present disclosure. The circuit 24 also includes an RF output port 28 that may be connected to an antenna. The quasi-differential amplifier circuit 24 is comprised of several major functional blocks, including the aforementioned balun circuit 10, a phase shifter network 30, a first amplifier 32, a second amplifier 34, and an output matching network 36. Additionally, there is a base bias network 38 and a collector bias network 40 that are connected to both the first amplifier 32 and the second amplifier 34.

One embodiment of the circuit 24 utilizes a transistor Q1 in the first amplifier 32, the collector of which is connected to the first differential port 12a of the balun circuit 10 through an amplifier interconnection inductor L2-1. Furthermore, the second amplifier 34 includes a transistor Q2, with its collector similarly being connected to the balun circuit 10, in particular, the second differential port 12b thereof through an amplifier interconnection inductor L2-2. Both of the inductors L2-1 and L2-2 are understood to be either a small value on-die inductor, or a short interconnect metal trace.

Although bipolar junction transistors Q1, Q2 are contemplated in the disclosed embodiment, it will be recognized that this is by way of example only and not of limitation. Any other suitable transistor type, such as field effect transistors, may be substituted without departing from the scope of the present disclosure. In this regard, while references are made to a base, a collector, and an emitter of a transistor, substitution of field effect transistors for the disclosed bipolar junction transistors will be understood to be accompanied by substitute references to a gate, a source, and a drain, respectively. Additionally, the first amplifier 32 and the second amplifier 34 need not be limited to single transistor configurations shown, and other configurations such as cascode structures may also be utilized. The transistors Q1 and Q2, along with the other components of the quasi-differential amplifier circuit 24, may be implemented on a single semiconductor die, or with discrete components. Additionally, a variety of different semiconductor technologies, such as Gallium Arsenide (GaAs), Silicon, bipolar junction, heterojunction bipolar (HBT), metal semiconductor field effect (MESFET), metal oxide semiconductor field effect (MOSFET) and others may be utilized in fabrication.

In addition to the inductor L2-2, the collector of the transistor Q2 is connected to the second differential port 12b in series with a compensation network 42 comprised of an inductor L7 and a capacitor C5. The compensation network 42 is understood to be tuned for rejecting third harmonic frequency components. The preferable rejection level of the third harmonics is greater than 60 to 70 dB. These components also serve an additional impedance matching function so that both transistors Q1 and Q2 are balanced with respect to current and voltage.

As indicated above, the balun circuit 10 has a single-ended port 14, which is connected to the common output matching network 36. The output matching network 36 is connected to a load, which by way of example has an impedance of 50 ohm, via the RF output port 28. In further detail, the output matching network 36 may include inductors L4, L5, and L6, and capacitors C3 and C4 to provide an impedance transformation from a predefined value to the load impedance of 50 ohm. In accordance with one embodiment, the predefined impedance may be 10 ohm. The values of the particular components of the output matching network 36, and in particular, the inductors L4 and L5, and the capacitor C3, are tuned to maximize the rejection of second harmonic frequency components. Preferably, the rejection of second harmonics is greater than 60 to 70 dB.

The collector bias network 40 is connected to both collectors of the transistors Q1, Q2, and specifically, to the amplifier interconnect inductors L2-1 and L2-2, respectively. The collector bias network 40 includes a common bias supply V2, as well as an RF decoupling capacitor C8. There is a pair of coupled inductors L5-1 and L5-2, with the inductor L5-1 being connected to the inductor L2-1/collector of the transistor Q1, and the inductor L5-2 being connected to the inductor L2-2/collector of the transistor Q2. The coupled inductors L5-1 and L5-2 are understood to provide additional impedance matching between the collectors of the transistors Q1, Q2 and the rest of the circuit. Additionally, these inductors function to balance the signals output from the transistors, and may be tuned to compensate for variations in other circuit components, variances resulting from fabrication process, physical layout, and so forth.

The input signal applied to the RF input port 26 is separated into a first split signal that is passed to the first amplifier 32, and a second split signal that is passed to the second amplifier 34. The second split signal is also phase shifted by 180 degrees relative to the first split signal. This splitting and phase shifting is achieved with the aforementioned phase shifter network 30, which includes a splitter 44 and a shifter 46. The splitter 44 is understood to be a conventional 3 dB splitter (such as of the Wilkinson type etc.) with a first port 44a to which the RF input port 26 is connected, a second port 44b, and a third port 44c. The second port 44b is connected to the input of the first amplifier 32, and specifically the base of transistor Q1 over capacitor C1-1 and inductor L1-1. The third port 44c is connected to an input of the shifter 46, and passed to the second amplifier 34, that is, the base of the transistor Q2 over capacitor C1-2 and inductor L1-2.

Again, the inductors L1-1 and L1-2 are understood to be either small value on-die inductors, or short interconnect metal traces. The capacitors C1-1 and C1-2 are selected for impedance matching the respective amplifiers 32, 34 to the RF input port 26. Along these lines, the grounded inductors L3-1 and L3-2 connected to the respective emitters of the transistors Q1, Q2, have small values tuned for additional impedance matching to the input signal source.

Each of the bases of the transistors Q1, Q2 are connected to the base bias network 38, which provides a control signal from a voltage source V1 to enable and disable the transistors Q1, Q2. The voltage source V1 is connected to another pair of coupled inductors L4-1 and L4-2 over a resistor R1 that sets the proper current level through the transistors Q1, Q2. An RF decoupling capacitor C7 is also connected to the resistor R1. The coupled inductor L4-1 is connected to the base of the transistor Q1, and specifically, at the junction between the capacitor C1-1 and inductor L1-1. The coupled inductors L4-1 and L4-2 provide additional impedance matching between the bases of the transistors Q1, Q2 and the rest of the circuit. These inductors also function to balance the input signals to the transistors, and may be tuned to compensate for variations in other circuit components, variances resulting from fabrication process, physical layout, and so forth. In on implementation the coupled inductors L4-1 and L4-2 (as well as the aforementioned coupled inductors L5-1 and L5-1 of the collector bias network 40) may be implemented on-die, and accordingly have a low footprint, allowing for a reduction in overall die size. The base bias network 38 also includes a capacitor C6 connected across the coupled inductors L4-1 and L4-2, and is used for impedance matching with the input signal source. The base bias network 38 allows the shorting of base-band components for modulated signals in linear applications, which enhances overall linearity of power amplifier chain. Although a particular configuration of the base bias network 38 has been described, alternatives such as current mirror architectures and the like may be readily substituted without departing from the present disclosure.

The quasi-differential amplifier circuit 24 may be generally characterized as an out-of-phase amplifier combining network with impedance transformation. Again, a single input signal is split and amplified separately. The power of the two separate signals is combined at a low impedance level, with the impedance being matched to a 50 ohm load at the final stage prior to output. The quasi-differential amplifier circuit 24 is contemplated to be suitable for both non-linear and linear applications, as will be illustrated and described in further detail below. There are various robustness improvements attributable to the aforementioned features of the amplifier circuit 24. For instance, even with a highly varying load impedance, collector-emitter voltage variation across the transistors Q1 and Q2 are minimal. Furthermore, variation in the output signal parameters partially attributable to variations in component values, assembly, signal routing, and the like can be minimized with the additional balancing circuit components described above.

Figure 6:
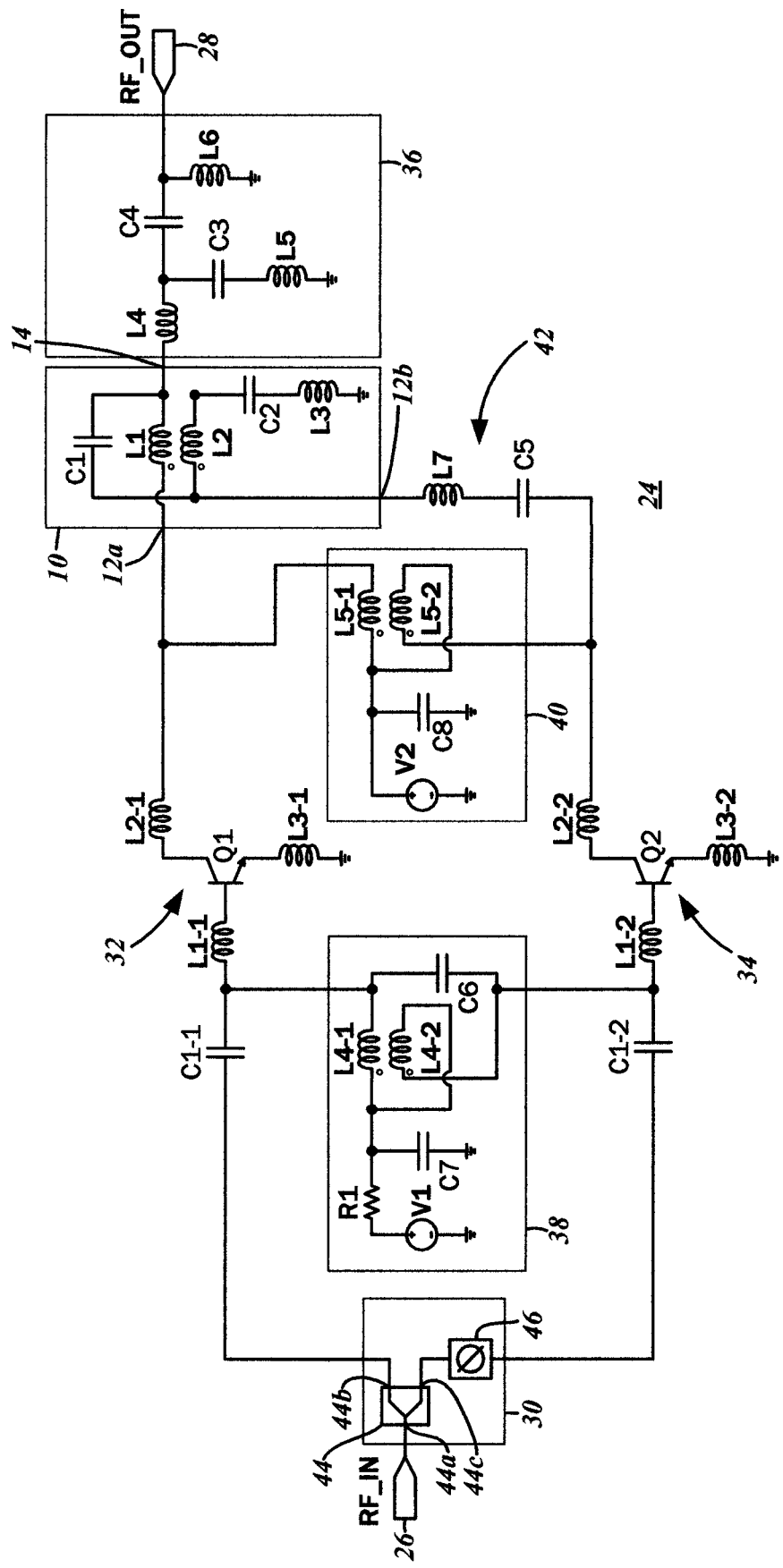
FIG. 6 is a schematic diagram of a quasi-differential amplifier circuit in accordance with one embodiment of the present disclosure.
Figure 7:
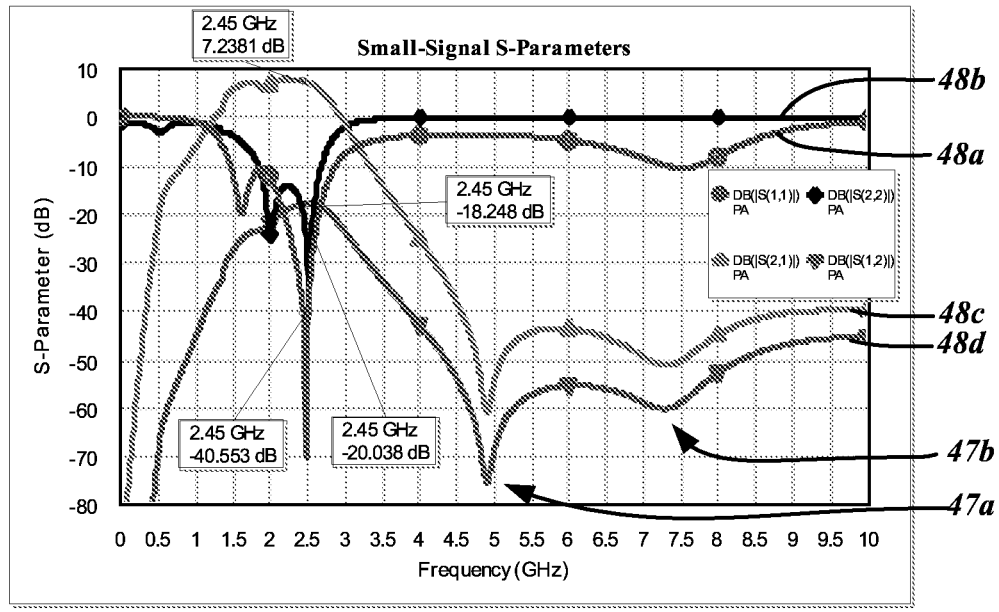
FIG. 7 is a graph showing the S-parameters of the quasi-differential amplifier circuit shown in FIG. 6 over an operating frequency range.
Figure 8:
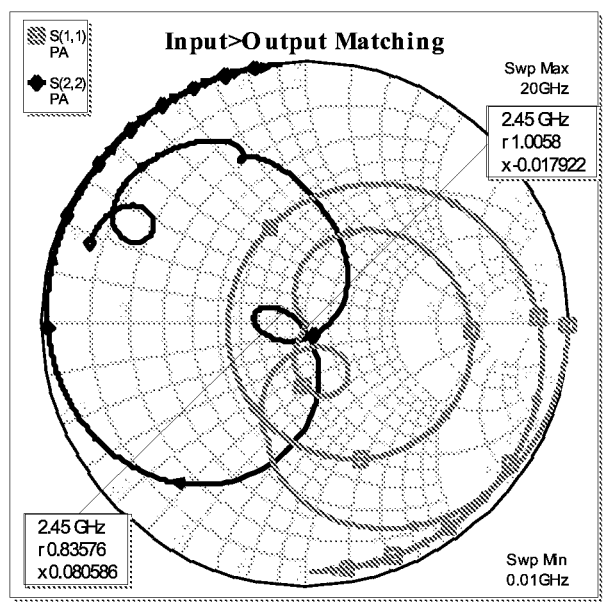
FIG. 8 is a Smith chart showing input impedance and output impedance matching of the quasi-differential amplifier circuit shown in FIG. 6.

The graph of FIG. 7 illustrates the small signal S-parameters of the quasi-differential amplifier circuit 24 of the present disclosure. As shown, there is a first plot 48a of $S_{11}$, the input reflection coefficient, a second plot 48b of $S_{22}$, the output reflection coefficient, as well as a third plot 48c of the forward gain $S_{21}$ and a fourth plot 48d of the reverse gain $S_{12}$. In the simulated example, the input signal is an RF signal in the 2.4 to 2.5 GHz band utilized for WiFi communications, and the bias supply voltage is 3.3 V. At the center operating frequency, forward gain is maximized, while input and output reflection coefficients are minimized. For an input signal source impedance of 9 ohm, and an output impedance of 50 ohm, the Smith chart of FIG. 8 plots $S_{11}$ and $S_{22}$, showing the input and output impedance matching for the quasi-differential amplifier circuit 24 shown in FIG. 6 at the center operating frequency.

The circuit 24 rejects second harmonics components in the ~4.9 GHz range as shown in a first rejection region 47a of both the third plot 48c (forward gain) and the fourth plot 48d (reverse gain). Additionally, the circuit 24 rejects third harmonics components in the ~7.4 GHz range as shown in a second rejection region 47b of the third plot 48c and the fourth plot 48d.

Figure 9:
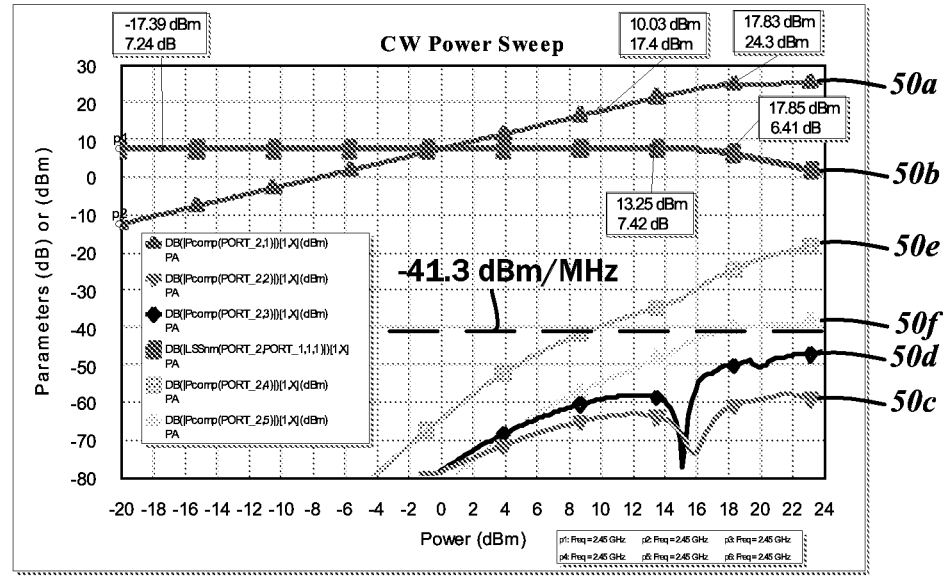
FIG. 9 is a graph plotting power levels and gain across a sweep of input power levels, along with the output of second, third, fourth and fifth harmonic signal components over the range of swept input power levels.
Figure 10:
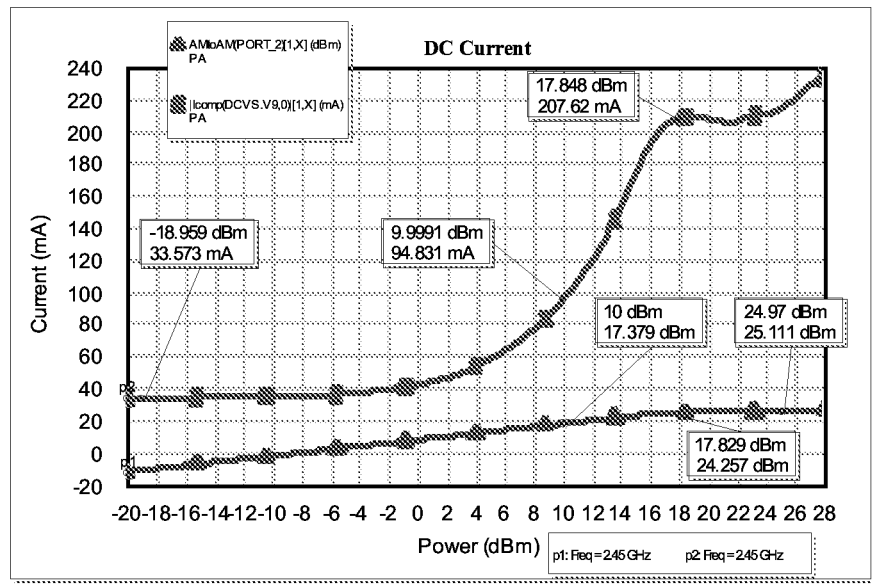
FIG. 10 is a graph plotting the DC current levels across a sweep of input power levels.

The graph of FIG. 9 plots the output, and components thereof, from the quasi-differential amplifier circuit 24 over a range of input power levels. The different input power levels correspond to the x-axis, with a first plot 50a showing the output power, and a second plot 50b showing the forward gain. As illustrated, the 1 dB compression point (P1 dB) is 24.3 dBm, corresponding to a large linear power level suitable for WiFi power amplifier implementations. A third plot 50c is the power level of second harmonic signal components, a fourth plot 50d is the power level of third harmonic signal components, a fifth plot 50e is the power level of fourth harmonic signal components, and a sixth plot 50f is the power level of fifth harmonic signal components, each given in dBm. A constant limit of −41.3 dBm/MHz spurious emission limits (as set by the United States Federal Communications Commission) is also plotted. The second and third harmonic signal components are expected to be under −60 dBm for the entire input power range, including the maximum linear power of 17 dBm. Furthermore, the fifth harmonic signal component is expected to be under −55 dBm for the same lineal power level. The graph of FIG. 10 illustrates the DC current consumption over the same range of input power levels, and shows that the operational parameters are in line with existing single-ended solutions.

In one embodiment of the quasi-differential amplifier circuit 24, the fourth harmonic signal component approaches the aforementioned −41.3 dBm/MHz limit. It would be possible to incorporate additional fourth harmonic rejection into a component connected to the RF output port 28 and an antenna. Furthermore, the antenna itself may have inherent fourth harmonic rejection characteristics. Because the regulatory limit is specified in terms of dBm/MHz, the particulars of the signaling modalities may not require an additional fourth harmonic rejection. For example, wideband output signal such as those of WiFi, even at the specified power levels, may not approach fourth harmonic output restrictions. At any rate, the rejection of all harmonic signal components up to the 1 dB compression point is well below this limit, especially with respect to WiFi signals.

Figure 11:
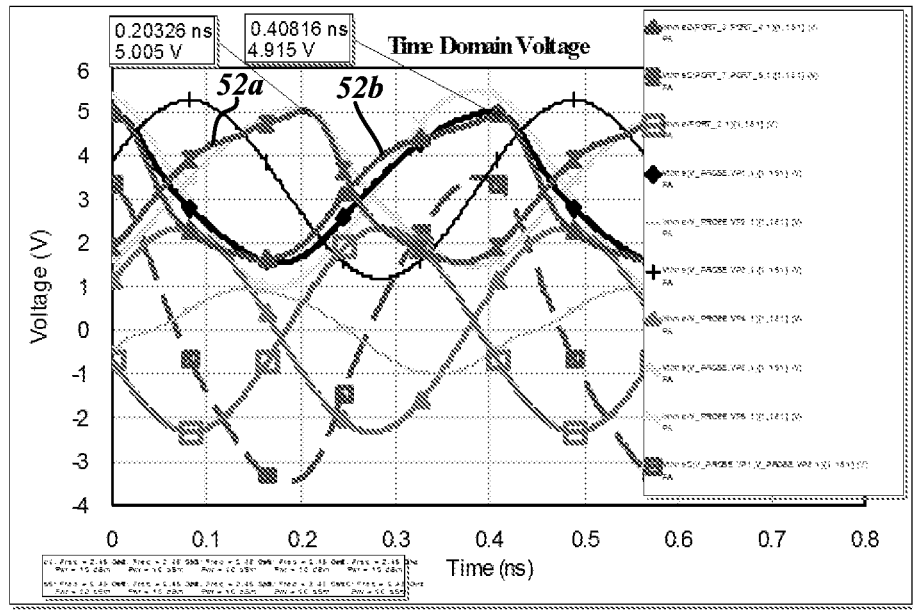
FIG. 11 is a graph of simulated time domain voltage waveforms at the transistors of the quasi-differential power amplifier circuit shown in FIG. 6.
Figure 12:
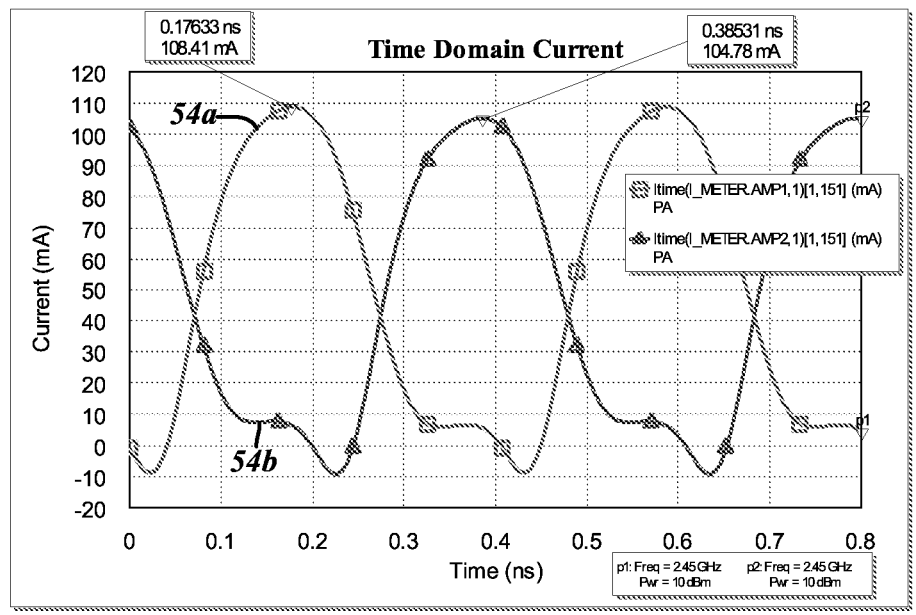
FIG. 12 is a graph of simulated time domain current waveforms at the transistors of the quasi-differential power amplifier circuit shown in FIG. 6.

The graphs of FIG. 11 and FIG. 12 are plots of the voltage and current wave forms in the time domain for an simulated input signal at 2.45 GHz with a power of +10 dBm at the input of the power amplifier circuit 24. With reference to FIG. 11, a first plot 52a is of a collector-emitter voltage for the transistor Q1, while a second plot 52b is of a collector-emitter voltage for the transistor Q2. Along these lines, with reference to FIG. 12, a first plot 54a is of the collector current for the transistor Q1, and a second plot 54b is of a collector current for the transistor Q2. Despite the large voltage and current amplitude imbalance, the voltage and current shapes, as well as the specific levels of voltage and current for each of the transistors Q1 and Q2 are similar. Thus, it is envisioned that the circuit 24 resemble a real differential amplifier that includes an proper output signal combining circuit.

Figure 13A:
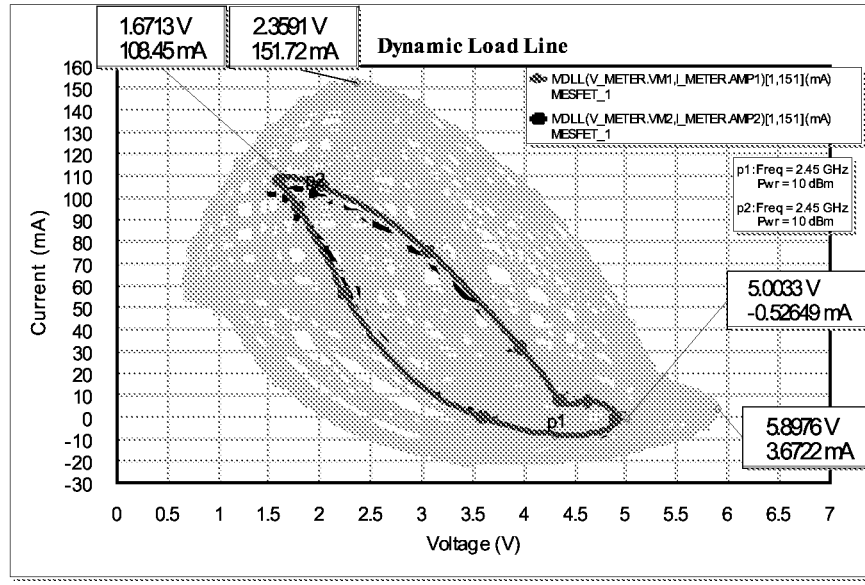
FIGS. 13A and 13B are simulation dynamic load line graphs for the transistors in the quasi-differential power amplifier circuit shown in FIG. 6 where input power is fixed at two different levels while load phase is varied from 0 to 360 degree at VSWR=10:1.
Figure 13B:
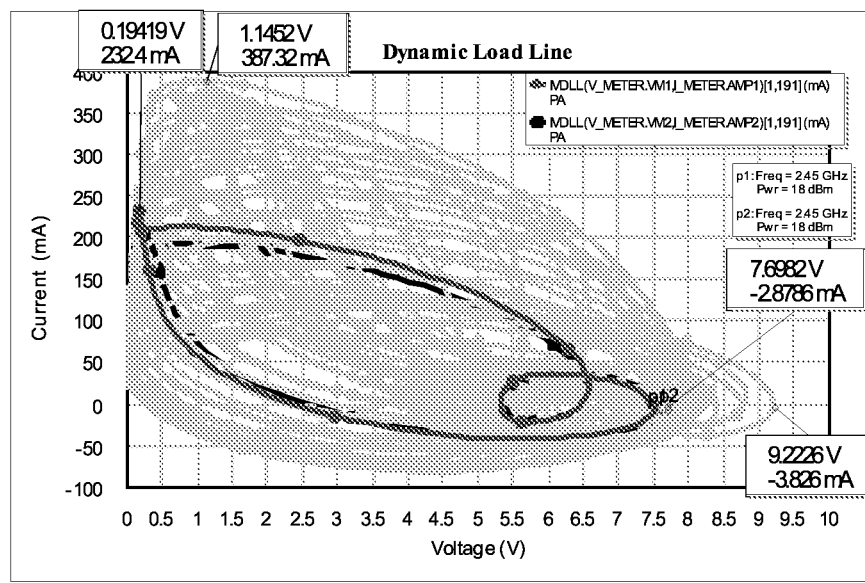

FIGS. 13A and 13B are dynamic load line graphs between the collector and the emitter of the transistors Q1 and Q2 for an input power of 10 dBm and 18 dBm, respectively at a 2.45 GHz center operating frequency. In further detail, the simulation depicted in FIG. 13A is an approximately 17 dBm highly linear data rate WiFi signal such as 802.11 g/n/ac, while the simulation depicted in FIG. 13B is an approximately 24 dBm low data rate WiFi signal such as 802.11b. The absolute maximum voltage amplitude different between collector-emitter terminals of the transistors Q1 and Q2 during load, where the voltage standing wave ratio (VSWR) is 10:1, the phase variation from 0 to 360 degrees is less than 20% higher in comparison to a 50 ohm load. The graphs of FIGS. 13A and 13B plot each 30 degree step of load phase. Whereas in a single-ended amplifier, the same load VSWR variation can readily double the voltage between the collector and emitter of the transistor, in the amplifier circuit 24 of the present disclosure, the maximum voltage over transistor terminals is substantially reduced. Accordingly, the reliability of the power amplifier is improved.

Figure 14:
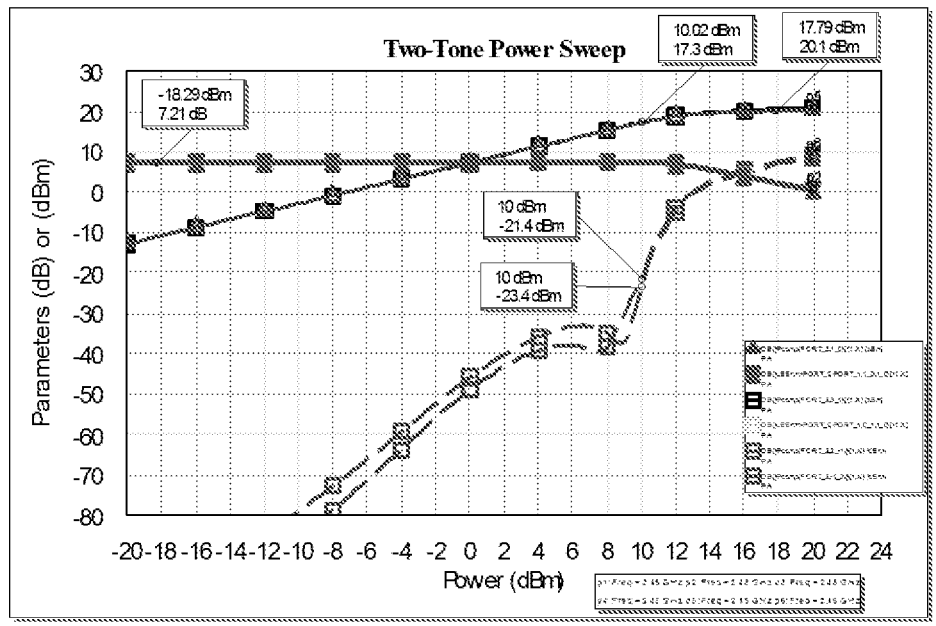
FIG. 14 is a graph of a two-tone power sweep for the quasi-differential power amplifier circuit of FIG. 6.
Figure 15:
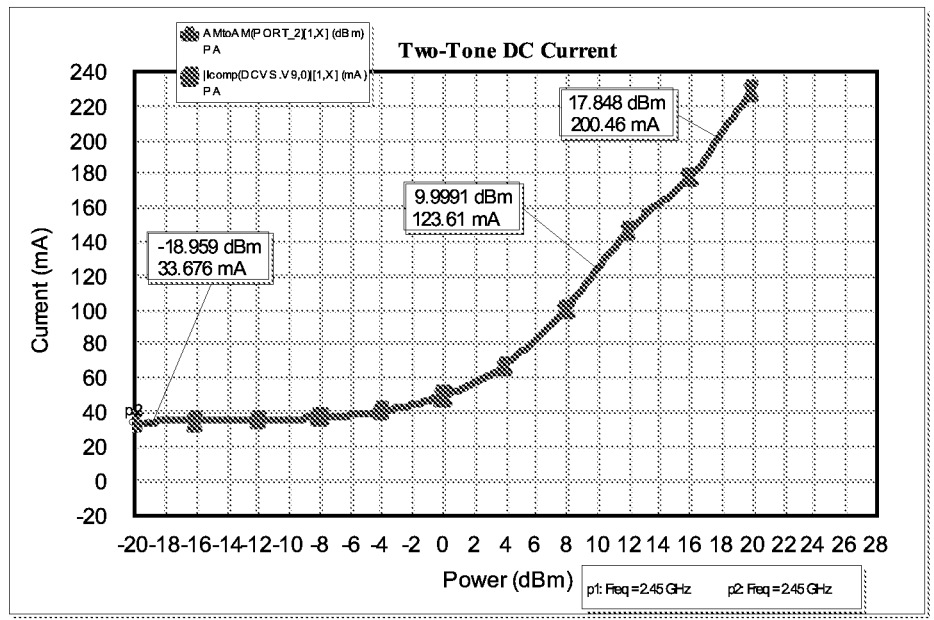
FIG. 15 is a graph of two-tone DC current sweep for the quasi-differential power amplifier circuit of FIG. 6.

The graph of FIG. 14 depicts a multiple frequency input power sweep of the quasi-differential amplifier circuit 24. The input frequencies or tones have carrier signals separated by 6 MHz, and the third order modulation distortion power in dBm are plotted on the graph. The maximum linear power for WiFi (802.11g/n) orthogonal frequency-division multiplexing (OFDM) is understood to be greater than 19 dBm as shown in the simulation. Furthermore, as shown in the graph of FIG. 15, the total current consumption is 123.6 mA at a linear output power of 20.6 dBm.

Figure 16:
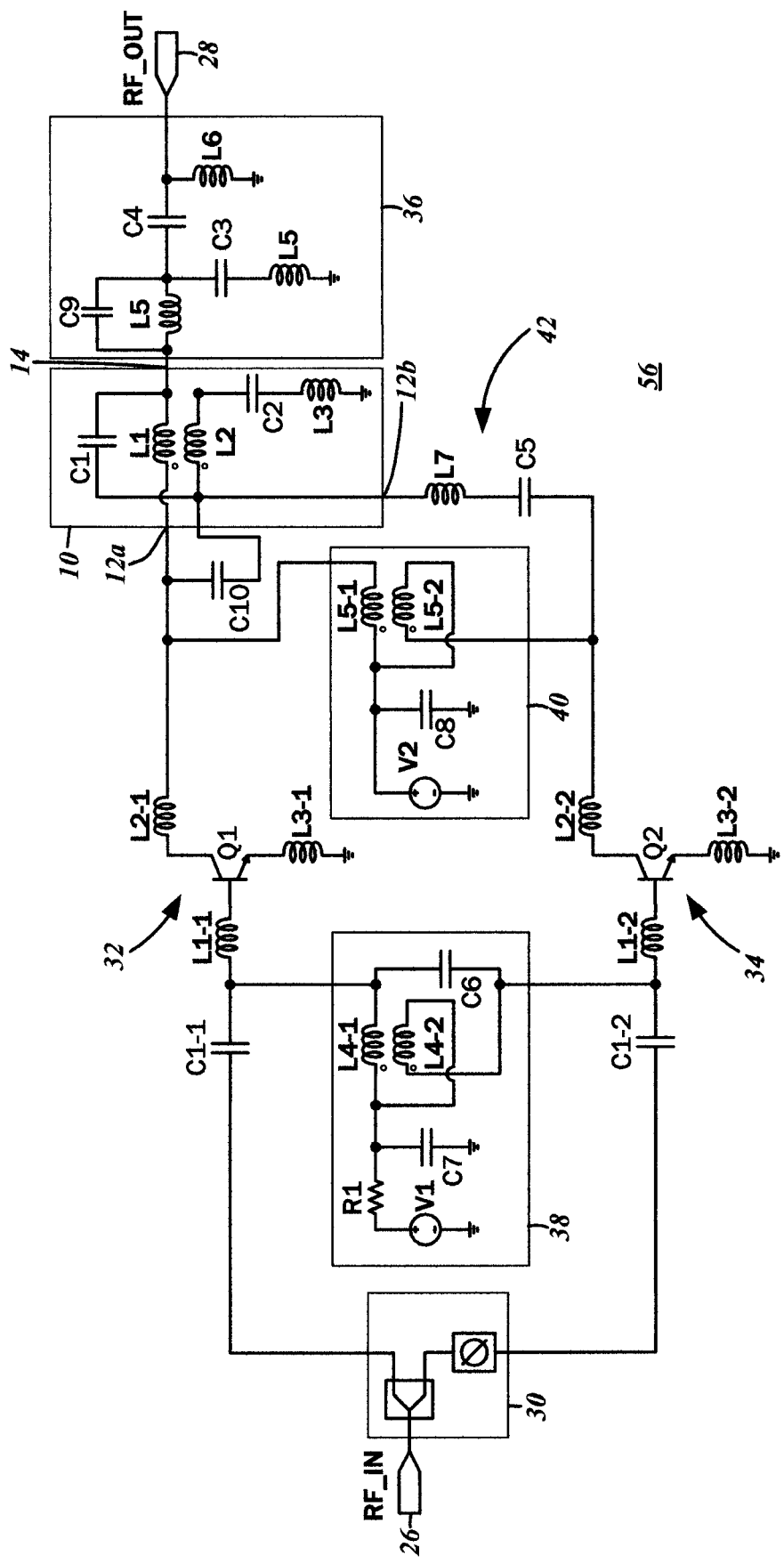
FIG. 16 is a schematic diagram of a quasi-differential amplifier circuit in accordance with a second embodiment of the present disclosure.
Figure 17:
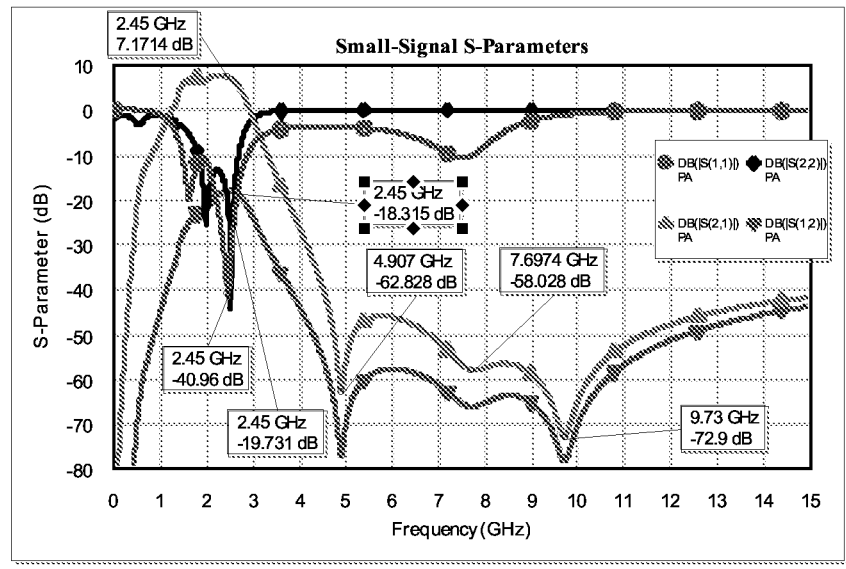
FIG. 17 is a graph showing the small signal S-parameters of the quasi-differential amplifier circuit shown in FIG. 16 over an operating frequency range.
Figure 18:
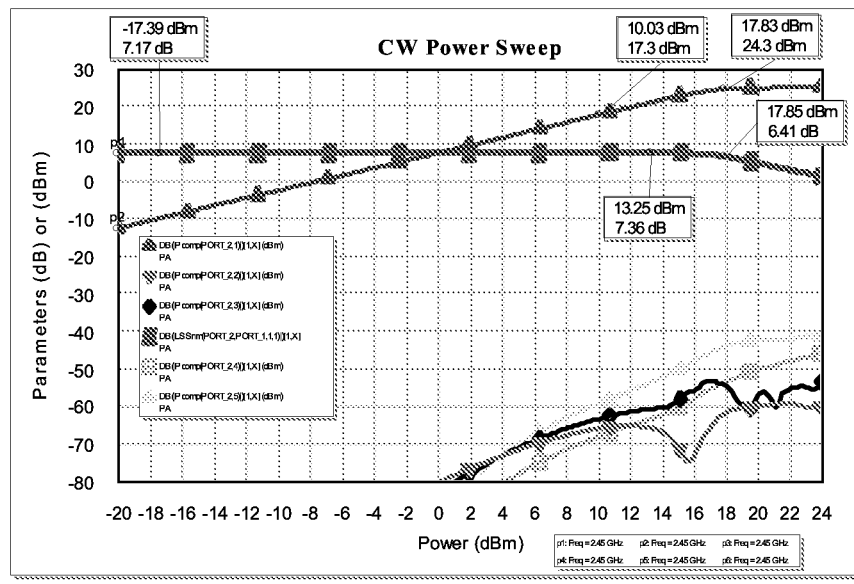
FIG. 18 is a graph plotting power levels and gain across a sweep of input power levels, along with the output of second, third, fourth and fifth harmonic signal components over the range of swept input power levels.
Figure 19:
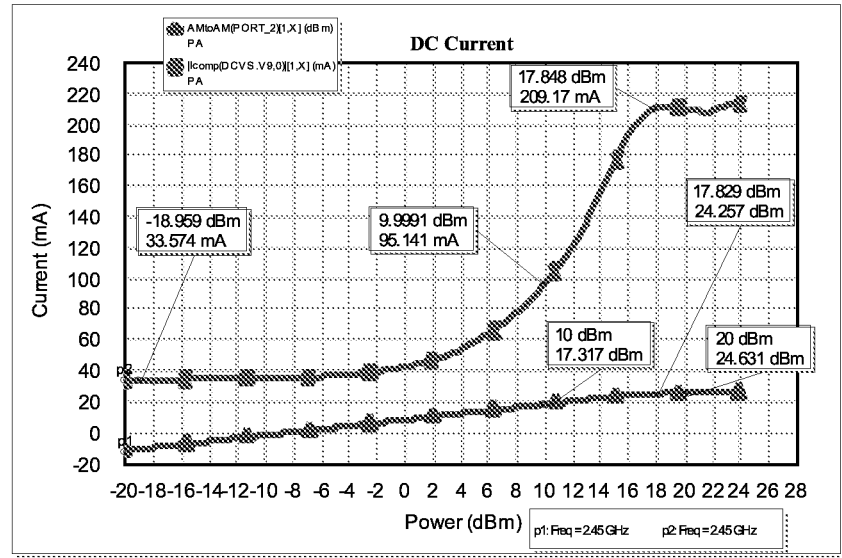
FIG. 19 is a graph plotting the DC current levels across a sweep of input power levels.
Figure 20:
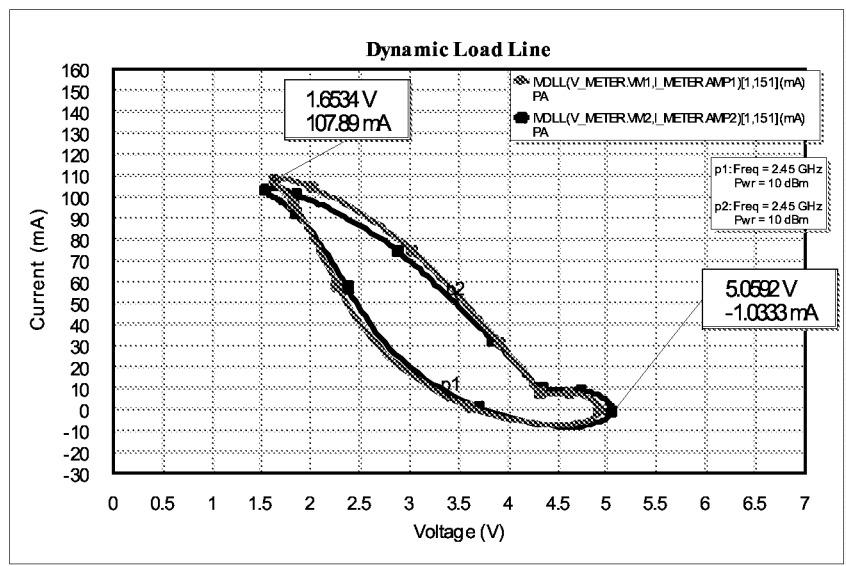
FIG. 20 is simulation dynamic load line graph for the transistors in the quasi-differential power amplifier circuit shown in FIG. 16 with a 50-Ohm load.

As briefly mentioned above, the quasi-differential amplifier circuit 24 depicted in FIG. 6 exhibits fourth and fifth harmonic rejection characteristics that may benefit from further improvement. FIG. 16 depicts another embodiment 56 contemplated to this end. Again, the quasi-differential amplifier circuit 56 is generally comprised of the RF input port 26 and the RF output port 28. Additionally, the same phase shifter network 30 to split the input signal into two signals, one of which is out-of-phase by 180 degrees, is incorporated. The same first amplifier 32 and the second amplifier 34 generally comprised of transistors Q1 and Q2, respectively, are connected to the two outputs from the phase shifter network 30. The base bias network 38 is the same and connected to each of the amplifiers 32, 34, as is the collector bias network 40. The output of the first amplifier 32 (the collector of the transistor Q1) is connected to the identically configured balun circuit 10, and specifically, the first differential port 12a thereof. The output of the second amplifier 34 (the collector of the transistor Q2) is connected to the second differential port 12b of the balun circuit over the same compensation network 42.

The single-ended port 14 of the balun circuit 10 is connected to the output matching network 36 as with the previously described embodiment, with the output thereof in turn being connected to the RF output port 28. There is a modification to the output matching network 36, however, comprised of connecting a capacitor C9 in parallel to the inductor L4. Together with the inductor L4, the capacitor C9 is tuned for rejecting the fourth harmonic signal component. Along these lines, there is a capacitor C10 connected to the second differential port 12b and the first differential port 12a that is tuned for rejecting the fifth harmonic signal component. The compensation network 42, comprised of the inductor L7 and the capacitor C5, continue to be tuned for rejecting the third harmonic signal component. Likewise, the inductor L4 and L5, as well as the capacitor C3 are tuned for rejecting the second harmonic signal component.

Figure 21:
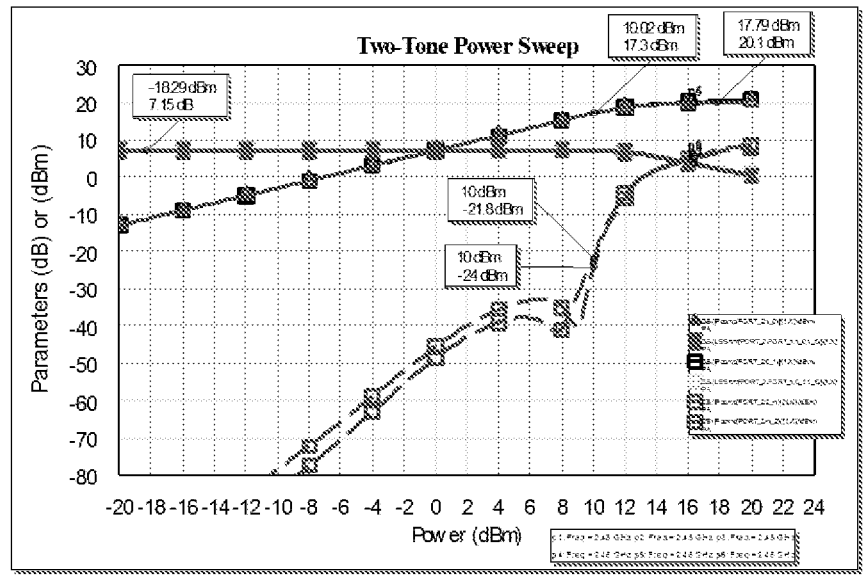
FIG. 21 is a graph of a two-tone power sweep for the quasi-differential power amplifier circuit of FIG. 16.
Figure 22:
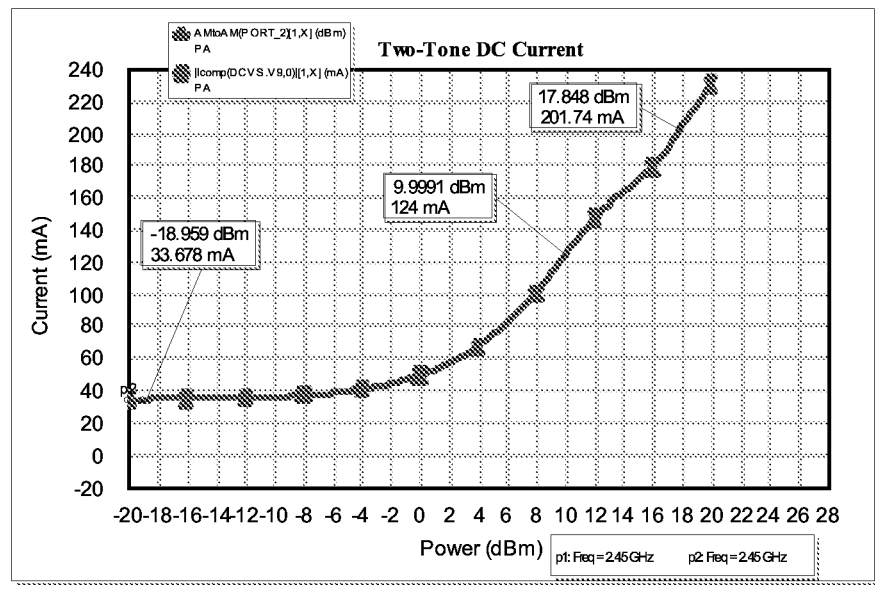
FIG. 22 is a graph of two-tone DC current sweep for the quasi-differential power amplifier circuit of FIG. 16.
Figure 23A:
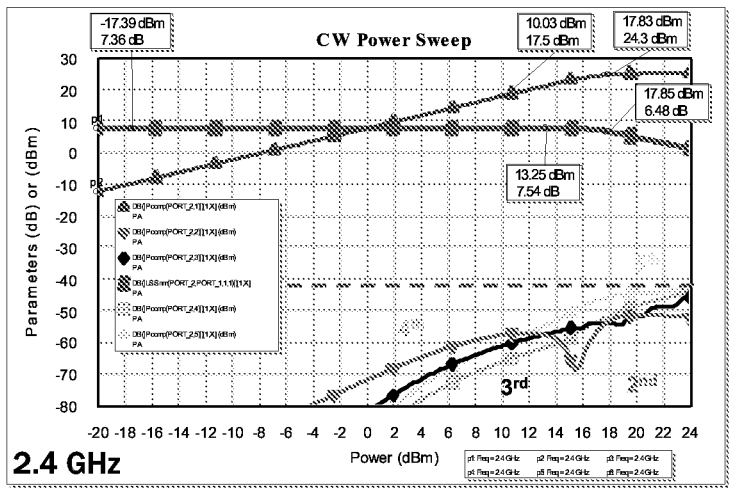
FIGS. 23A, 23B, and 23C are graphs plotting power levels and gain across a sweep of input power levels, along with the output of second, third, fourth and fifth harmonic signal components over the range of swept input power levels at the 2.4 GHz, 2.45 GHz, and 2.5 GHz frequencies.
Figure 23B:
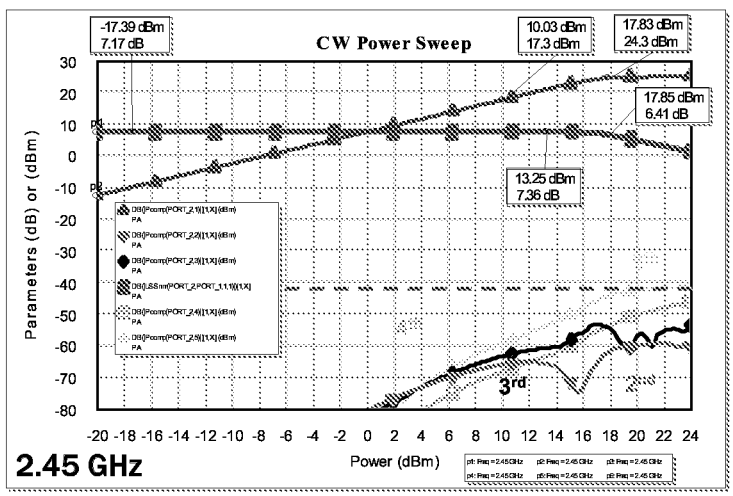
Figure 23C:
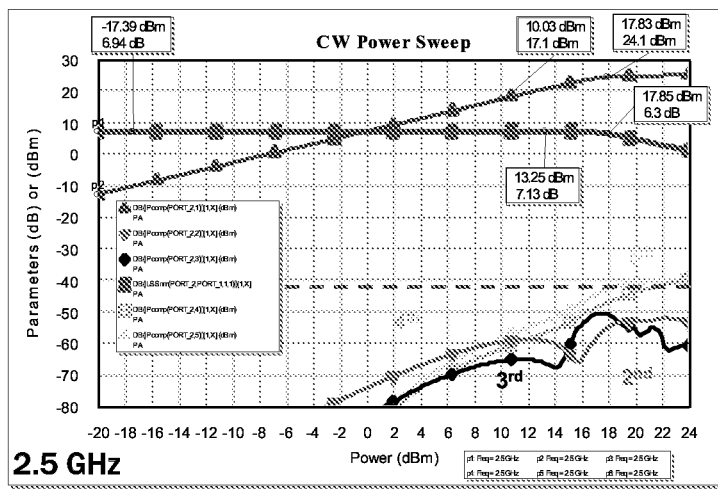

With reference to the various graphs of FIGS. 17, 18, 19, and 20, the performance of the second embodiment of the quasi-differential amplifier circuit 56 are simulated. The results are substantially similar to those of the first embodiment 24 discussed above, but with the notable improvement in the fourth and fifth harmonics rejection characteristics. As shown in the graphs of FIGS. 21 and 22, the addition of the fourth and fifth harmonics rejection components, e.g., capacitors C9 and C10, the linear performance of the circuit 56 remains unchanged. The total current consumption is 124 mA at a linear output power of 20.6 dBm. The performance of the quasi-differential amplifier circuit 56 remains the same over the operating frequency range of 2.4 GHz to 2.5 GHz, as shown in the graphs of FIGS. 23A-23C.

Along these lines, variations in different circuit components have also been simulated. Only a small variation of the operating parameters is expected in response to component value differences attributable to the fabrication technology, assembly, routing of interconnections, and so forth.

Figure 24A:
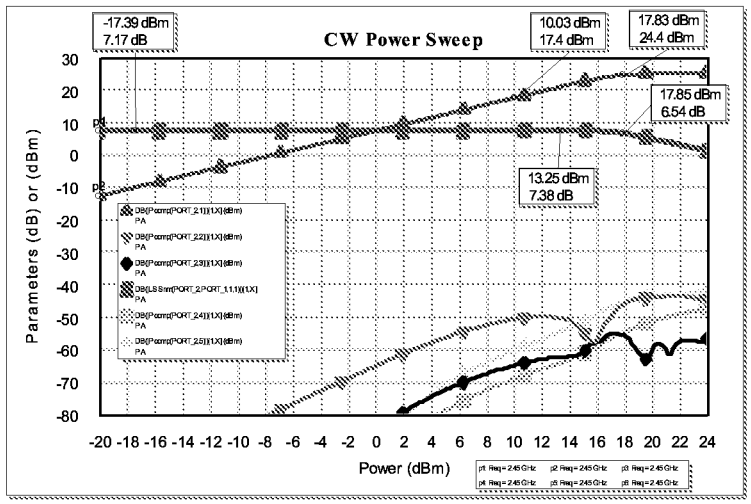
FIGS. 24A, 24B, and 24C are graphs showing the small signal S-parameters of the quasi-differential amplifier circuit shown in FIG. 16 with different second harmonic bond wire inductance variations of −10%, nominal, and +10%.
Figure 24B:
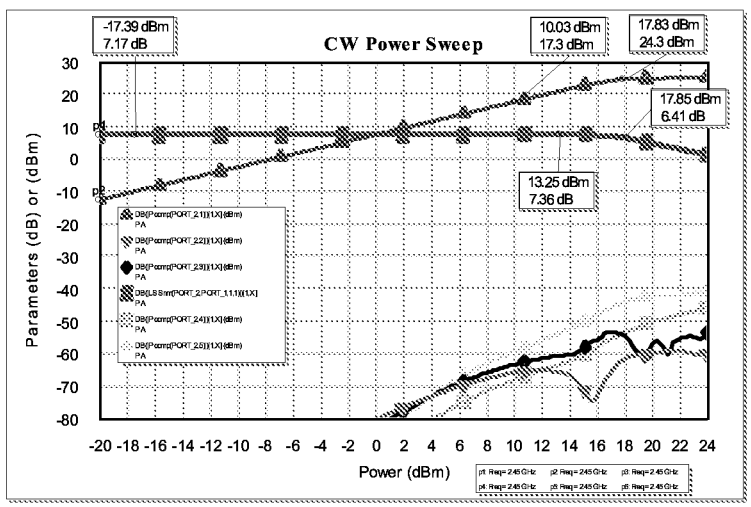
Figure 24C:
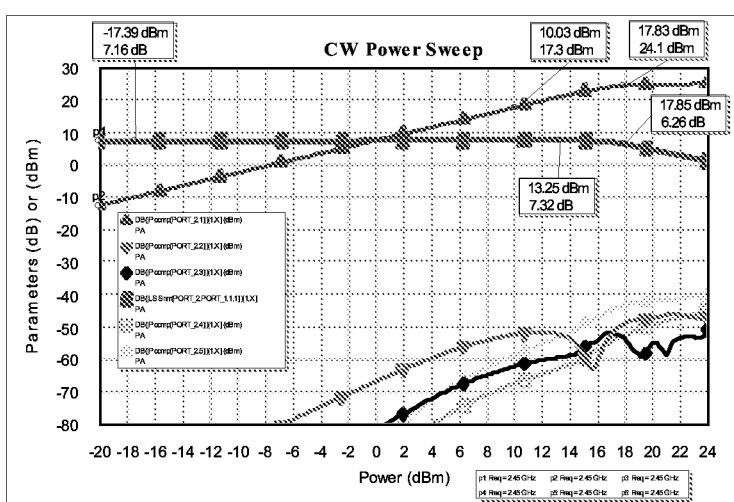

The graphs of FIGS. 24A-24C illustrate harmonics suppression for different second harmonic bond wire inductance variations, with FIG. 24A directed to a −10% variation, FIG. 24B directed to a nominal value, and FIG. 24C directed a +10% variation. It is understood that these variations result in a maximum total gain variation of 0.01 dB, while linearity (P1 dB) changes less than 0.1 dB. Furthermore, all harmonics signal components are less than −50 dBm up to an output power of +20 dBm.

Figure 25A:
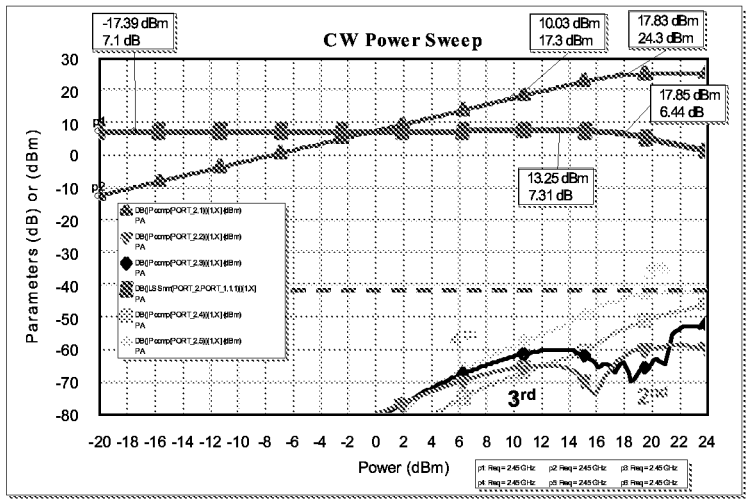
FIGS. 25A, 25B, and 25C are graphs showing the small signal S-parameters of the quasi-differential amplifier circuit shown in FIG. 16 with different balun ground wire inductance variations of −10%, nominal, and +10%.
Figure 25B:
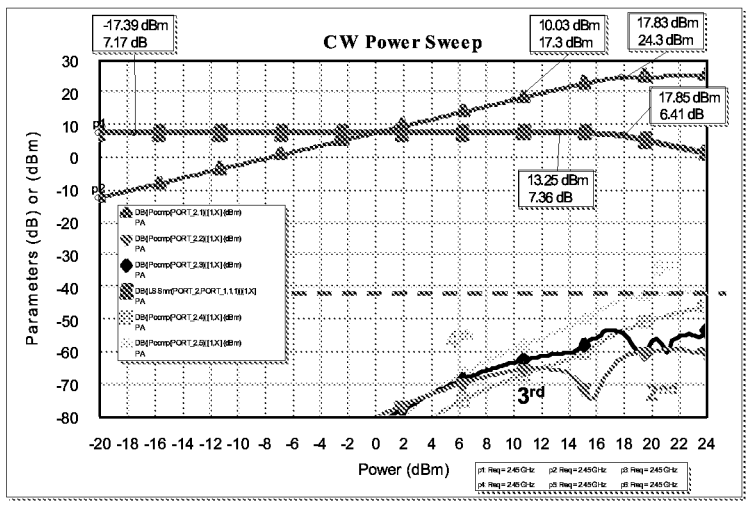
Figure 25C:
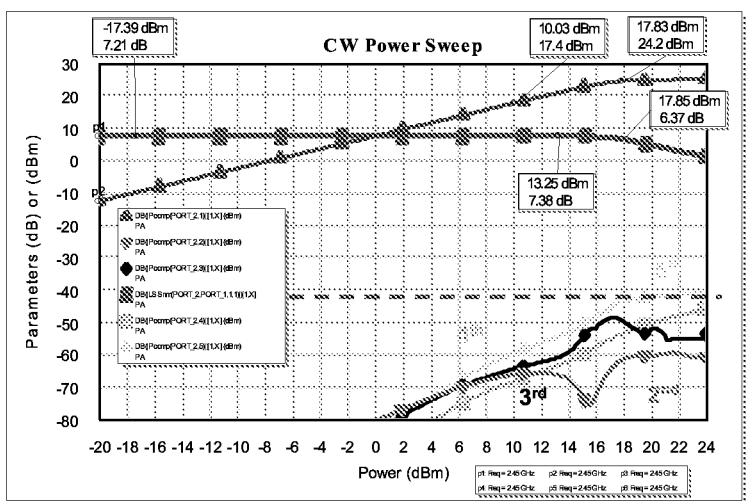

The graphs of FIGS. 25A-25C illustrate harmonics suppression for different balun ground bond wire inductance variations, with FIG. 25A directed to a −10% variation, FIG. 25B directed to a nominal value, and FIG. 25C directed to a +10% variation. It is understood that these variations result in a maximum total gain variation of 0.1 dB, while linearity (P1 dB) changes less than 0.1 dB. All harmonics signal components are less than −56 dBm up to an output power of +20 dBm.

Figure 26A:
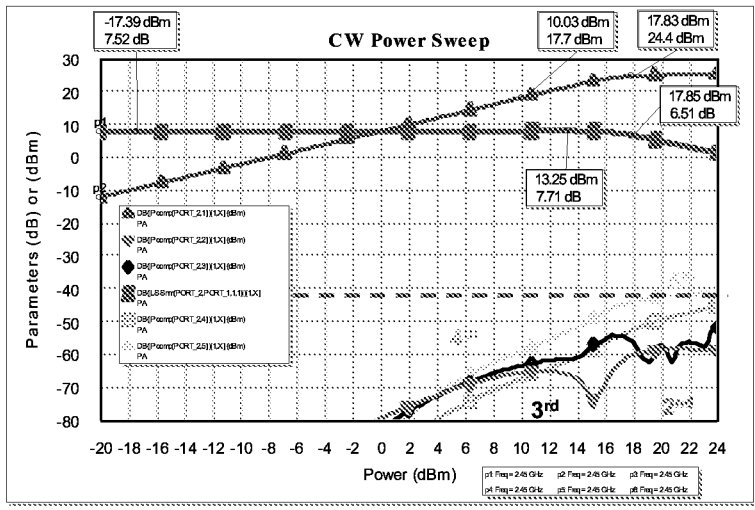
FIGS. 26A, 26B, and 26C are graphs showing the small signal S-parameters of the quasi-differential amplifier circuit shown in FIG. 16 with different power amplifier emitter bond wire inductance variations of −10%, nominal, and +10%.
Figure 26B:
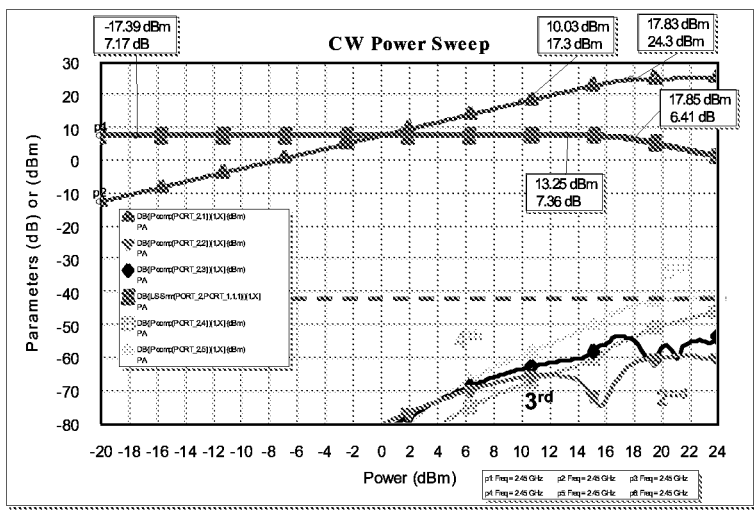
Figure 26C:
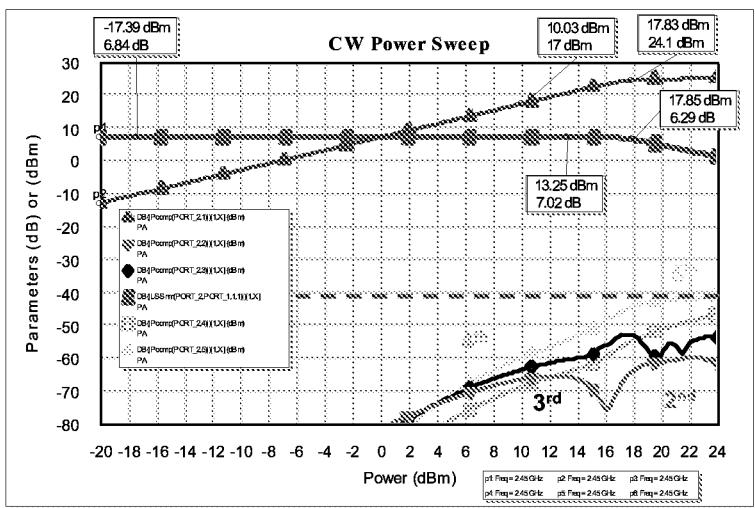

The graphs of FIGS. 26A-26C illustrate harmonics suppression for different power amplifier emitter bond wire inductance variations, with FIG. 26A directed to a −10% variation, FIG. 26B directed to a nominal value, and FIG. 26C directed to a +10% variation. It is understood that these variations result in a maximum total gain variation of 0.6 dB, while linearity (P1 dB) changes less than 0.2 dB. All harmonics signal components are less than −56 dBm up to an output power of +20 dBm.

Figure 27A:
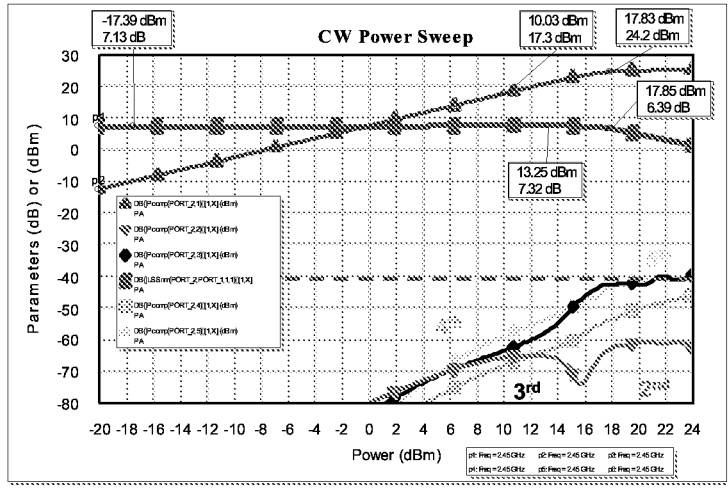
FIGS. 27A, 27B, and 27C are graphs showing the small signal S-parameters of the quasi-differential amplifier circuit shown in FIG. 16 with different input signal phase imbalance variations of −/+10 degrees, nominal (180 degrees), and +/−10 degrees.
Figure 27B:
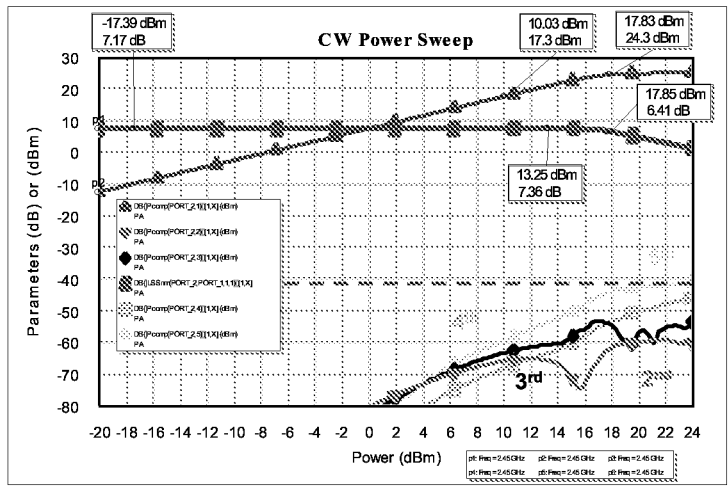
Figure 27C:
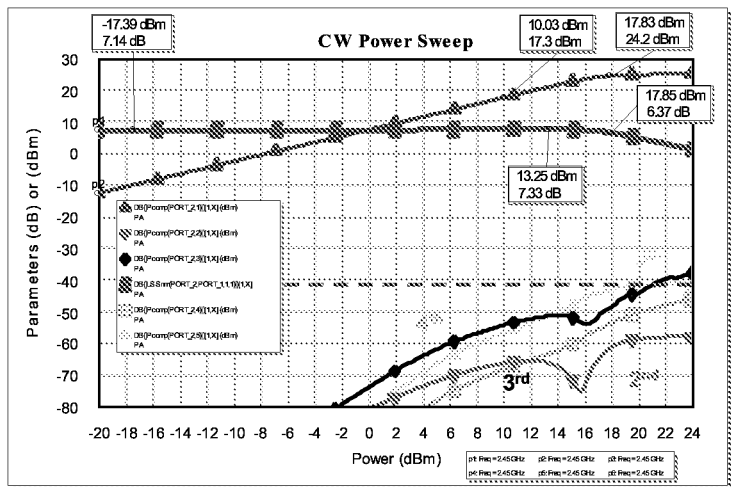

The graphs of FIGS. 27A-27C illustrate harmonics suppression for different input signal phase imbalance variations, with FIG. 27A directed to a −/+10 degrees variation, FIG. 27B directed to a nominal value (180 degrees), and FIG. 27C directed to a +/−10 degrees variation. As shown, the absolute input signal phase imbalance difference of 20 degrees results in a small influence on the operational characteristics of the quasi-differential amplifier circuit 56, including harmonics suppression, up to an output power of +20 dBm.

Figure 28A:
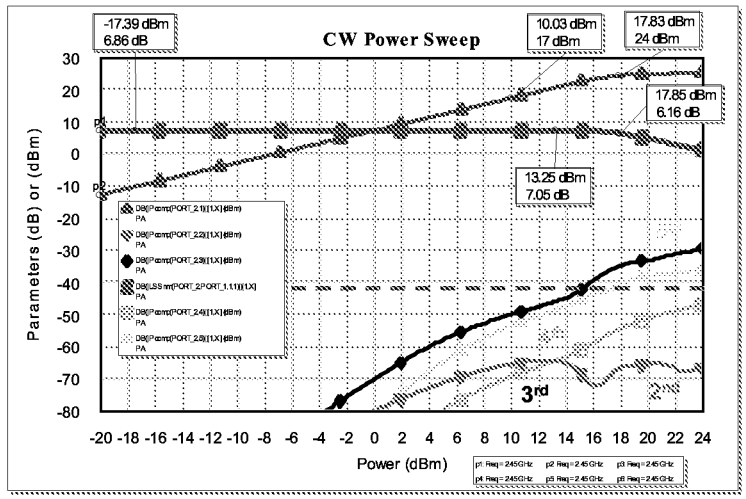
FIGS. 28A, 28B, and 28C are graphs showing the small signal S-parameters of the quasi-differential amplifier circuit shown in FIG. 16 with different input signal phase imbalance variations of −/+30 degrees, nominal (180 degrees), and +/−30 degrees.
Figure 28B:
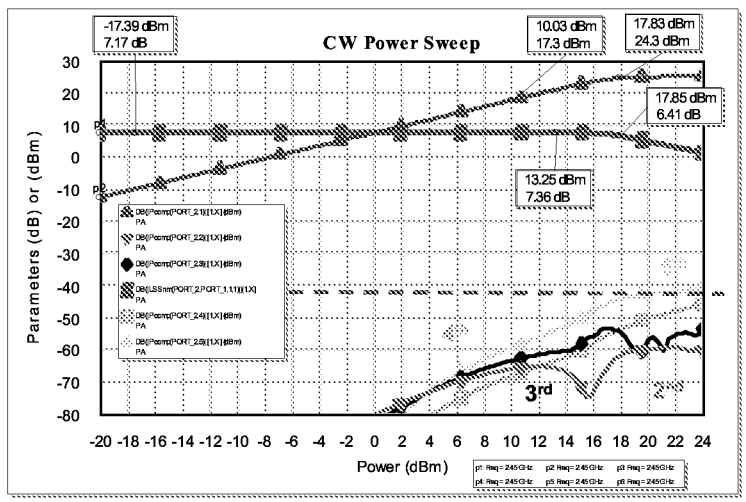
Figure 28C:
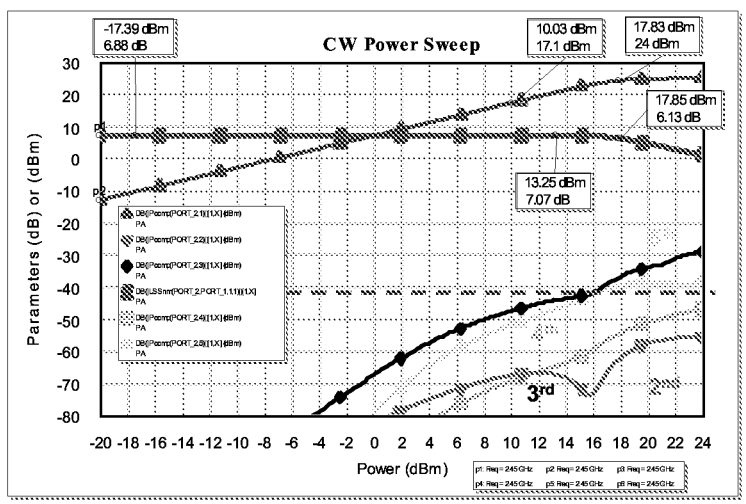

The graphs of FIGS. 28A-28C illustrate harmonics suppression for different input signal phase imbalance variations, with FIG. 28A directed to a −/+30 degrees variation, FIG. 28B directed to a nominal value (180 degrees), and FIG. 28C directed to a +/−30 degrees variation. The absolute input signal phase imbalance difference of 60 degrees results in a maximum 0.3 dB total gain variation, while linearity (P1 dB) changes less than 0.3 dB. All harmonics remain below −46 dBm, up to an output power of +20 dBm.

Figure 29A:
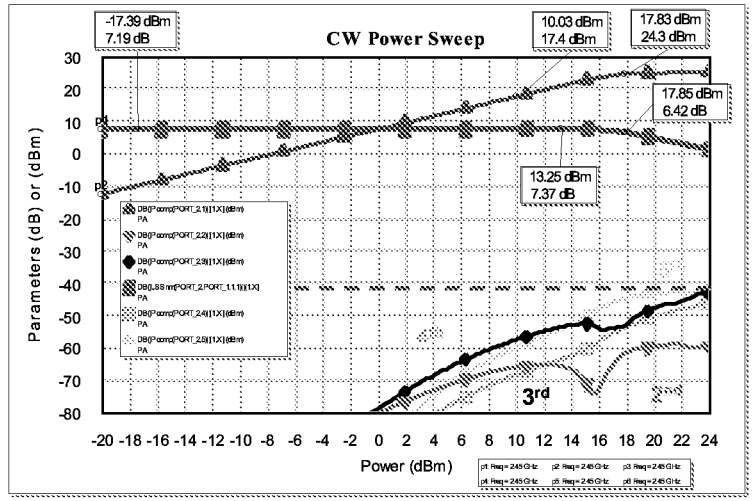
FIGS. 29A, 29B, and 29C are graphs showing the small signal S-parameters of the quasi-differential amplifier circuit shown in FIG. 16 with different input signal amplitude imbalance variations of −/+0.5 dB, nominal (0 dB), and +/−0.5 dB.
Figure 29B:
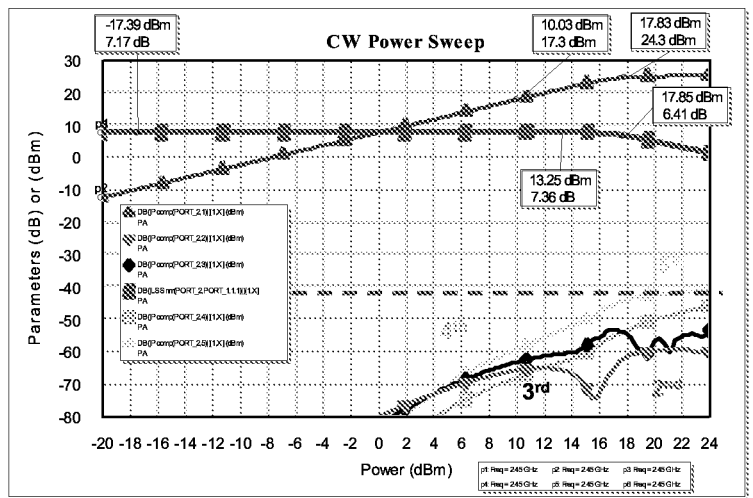
Figure 29C:
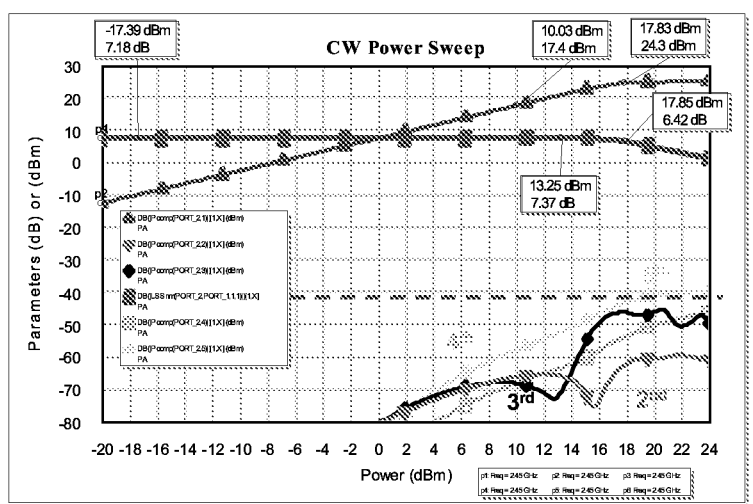

The graphs of FIGS. 29A-29C illustrate harmonics suppression for different input signal amplitude imbalance variations, with FIG. 29A directed to a −/+0.5 dB variation, FIG. 29B directed to a nominal value (0 dB), and FIG. 29C directed to a +/−0.5 dB variation. The absolute input signal amplitude imbalance difference of 1 dB has a minimal influence on the operational characteristics of the quasi-differential amplifier circuit 56.

Figure 30A:
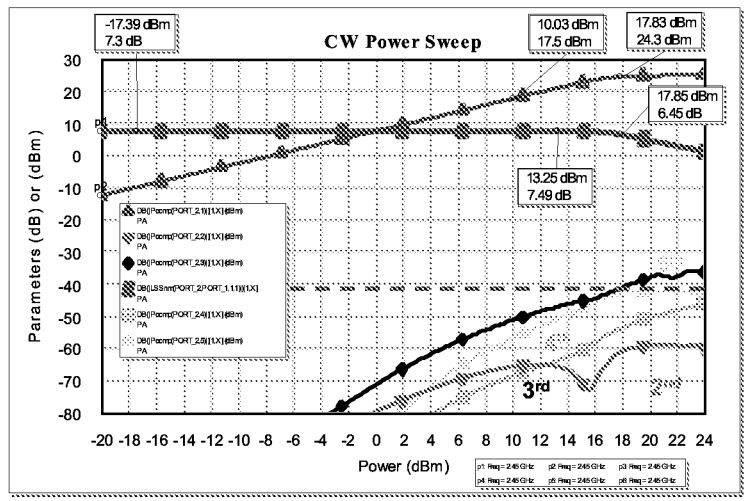
FIGS. 30A, 30B, and 30C are graphs showing the small signal S-parameters of the quasi-differential amplifier circuit shown in FIG. 16 with different input signal amplitude imbalance variations of −/+1.5 dB, nominal (0 dB), and +/−1.5 dB.
Figure 30B:
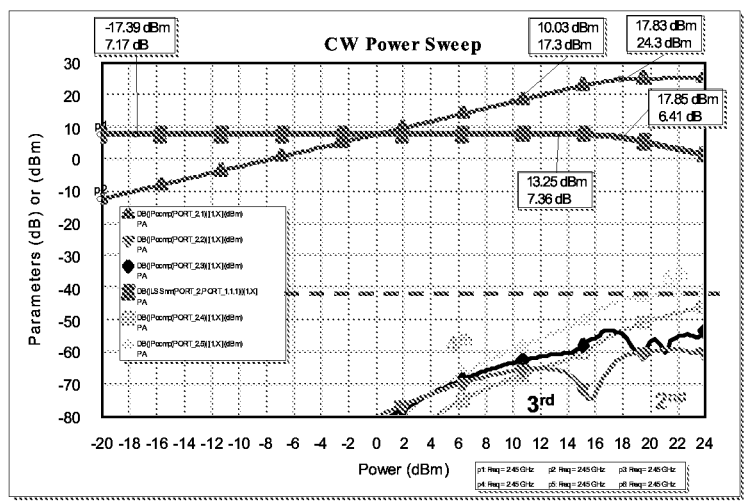
Figure 30C:
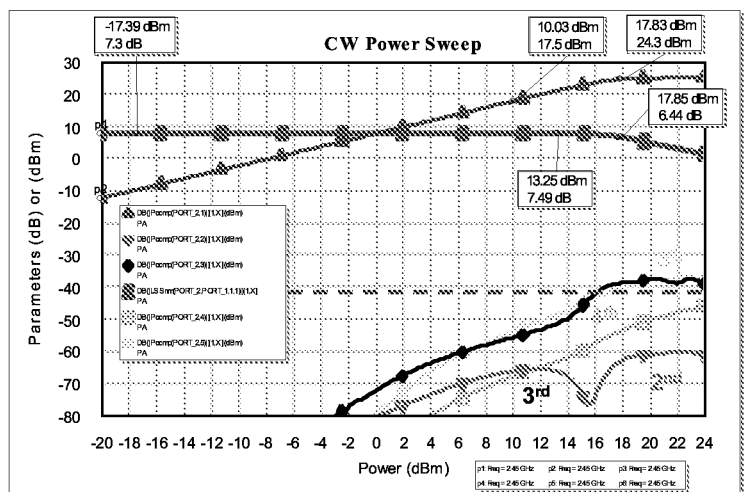

The graphs of FIGS. 30A-30C illustrate harmonics suppression for different input signal amplitude imbalance variations, with FIG. 30A directed to a −/+1.5 dB variation, FIG. 30B directed to a nominal value (0 dB), and FIG. 30C directed to a +/−1.5 dB variation. The absolute input signal amplitude imbalance difference of 3 dB results in a maximum 0.2 dB total gain variation, while linearity (P1 dB) changes less than 0.2 dB. All harmonics remain below −49 dBm, up to an output power of +20 dBm.

Figure 31A:
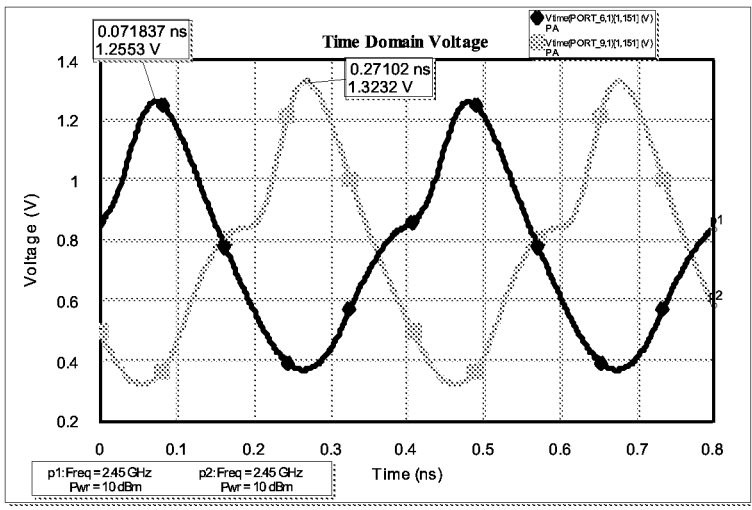
FIGS. 31A, 31B, and 31C are graphs showing the time domain voltage waveforms of the base voltage at the first and second amplifiers of the quasi-differential amplifier circuit shown in FIG. 16 with different amplitude imbalance variations of −/+1.5 dB, nominal (0 dB), and +/−1.5 dB.
Figure 31B:
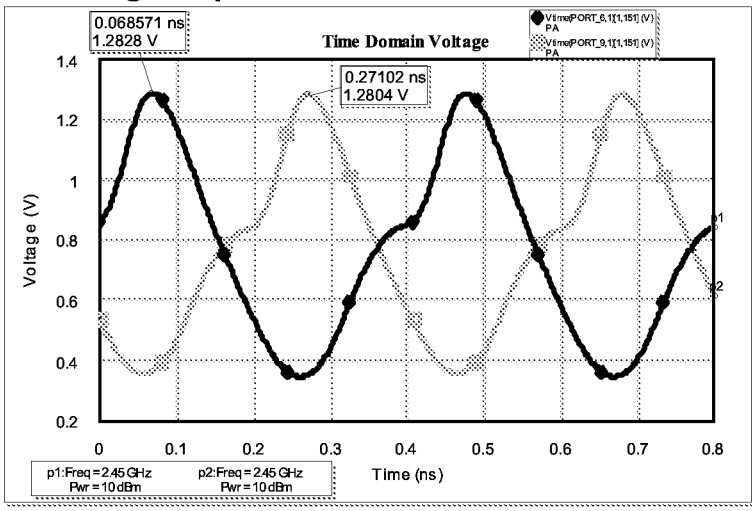
Figure 31C:
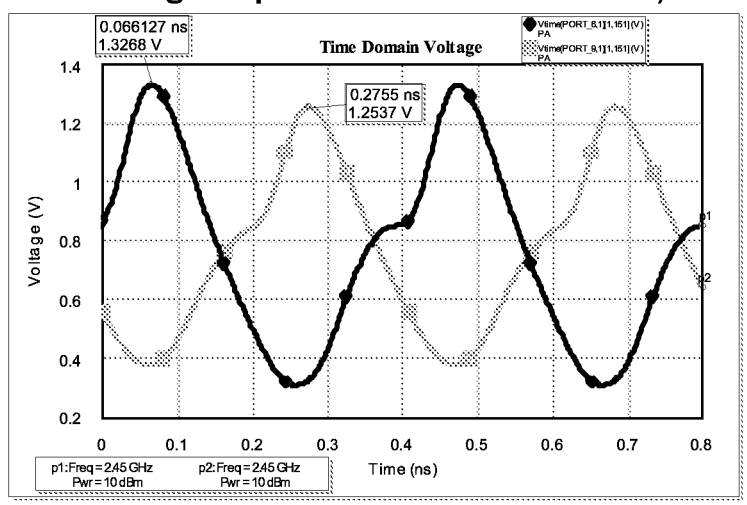

The graphs of FIGS. 31A-31C are base voltages of the transistors Q1 and Q2 for different signal amplitude imbalance variations, with FIG. 31A directed to a −/+1.5 dB variation, FIG. 31B directed to a nominal value (0 dB), and FIG. 31C directed to a +/−1.5 dB variation. The absolute amplitude imbalance difference of 3 dB results in a 6% or approximately 0.5 dB signal voltage difference at the base of the transistors Q1 and Q2. The total power of the input signal is understood to remain the same across all three variations of the signal amplitude imbalance.

Figure 32A:
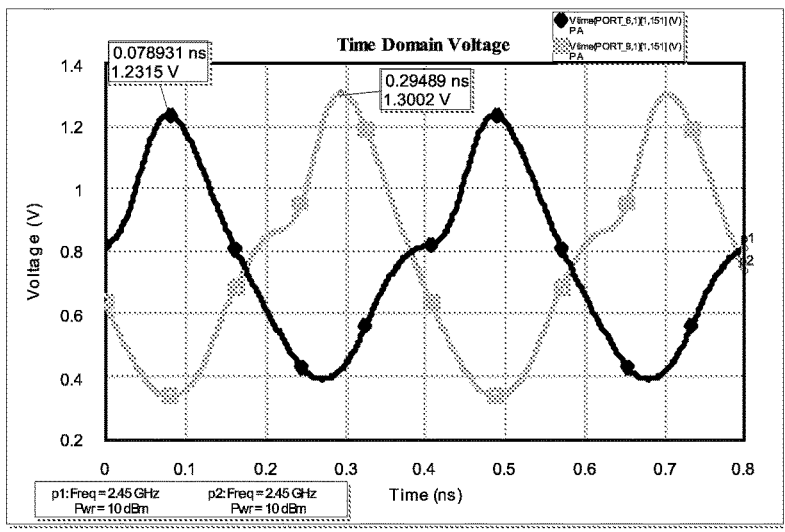
FIGS. 32A, 32B, and 32C are graphs showing the time domain voltage waveforms of the base voltage at the first and second amplifiers of the quasi-differential amplifier circuit shown in FIG. 16 with different phase imbalance variations of −/+30 degrees, nominal (180 degrees), and +/−30 degrees.
Figure 32B:
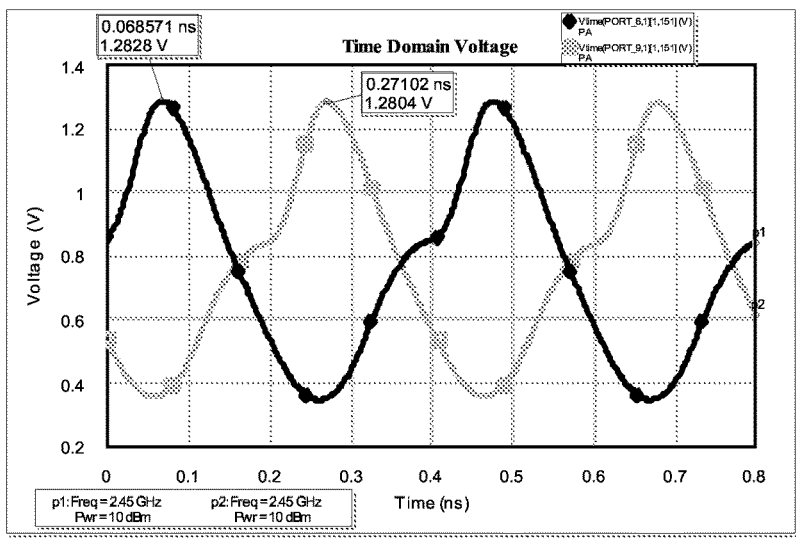
Figure 32C:
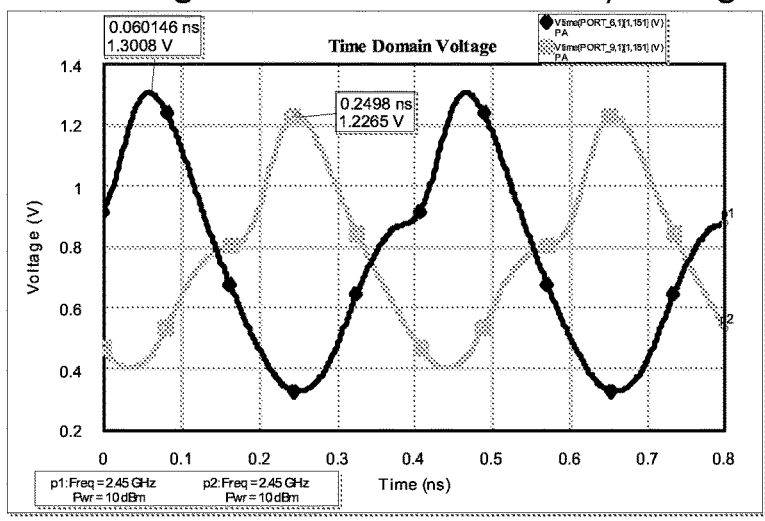

The graphs of FIGS. 32A-32C are base voltages of the transistors Q1 and Q2 for different signal phase imbalance variations, with FIG. 32A directed to a −/+30 degree variation, FIG. 32B directed to a nominal value (0 degrees), and FIG. 32C directed to a +/−30 degree variation. The absolute phase imbalance difference of 60 degrees dB results in a 6% or approximately 0.5 dB signal voltage difference at the base of the transistors Q1 and Q2. The total power of the input signal is understood to remain the same across all three variations of the signal phase imbalance.

Figure 33A:
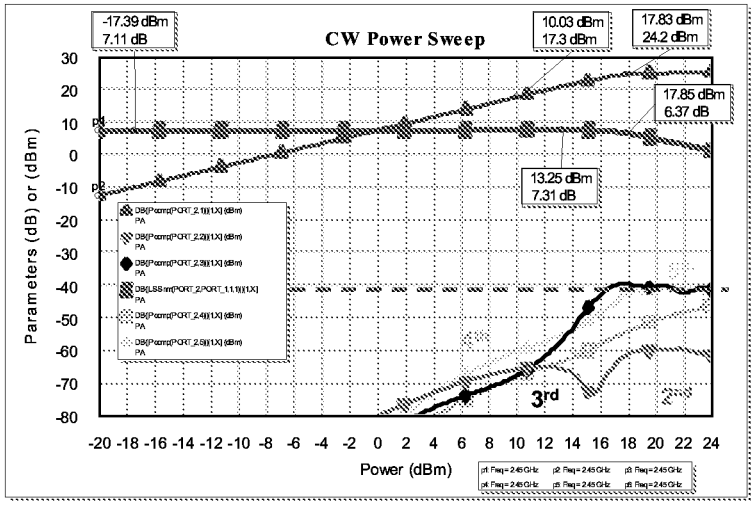
FIGS. 33A, 33B, and 33C are graphs showing the small signal S-parameters of the quasi-differential amplifier circuit shown in FIG. 16 with different collector bias inductor variances.
Figure 33B:
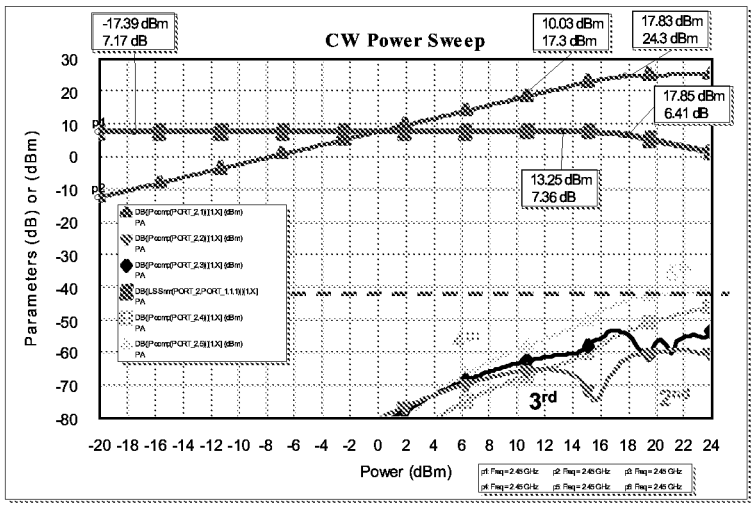
Figure 33C:
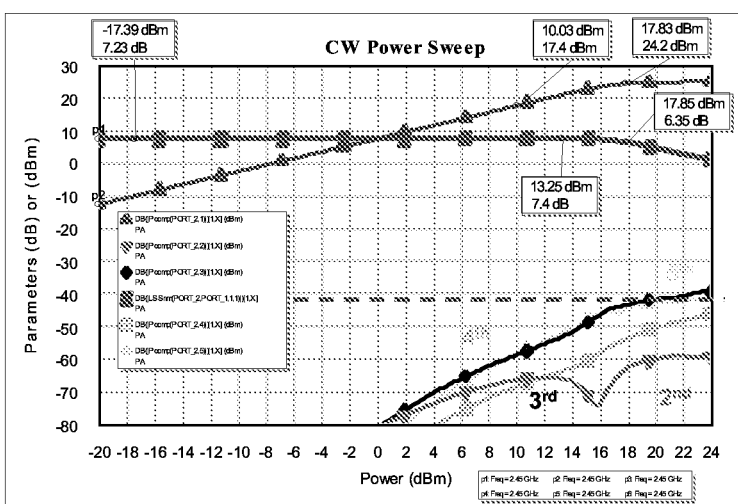

The graphs of FIGS. 33A-33C illustrate harmonics suppression for different VCC bias inductors variations, with FIG. 33A directed to the first coupled inductor L5-1 with a −10% variation and the second coupled inductor L5-2 with a +10% variation, FIG. 33B directed to a nominal value for both inductors, and FIG. 33C directed to a first coupled inductor L5-1 with a +10% variation and the second coupled inductor L5-2 with a −10% variation. It is understood that with a 20% absolute difference, a maximum total gain variation of 0.1 dB is exhibited, while linearity (P1 dB) remains the same. All harmonics signal components are less than −50 dBm up to an output power of +20 dBm.

Figure 34A:
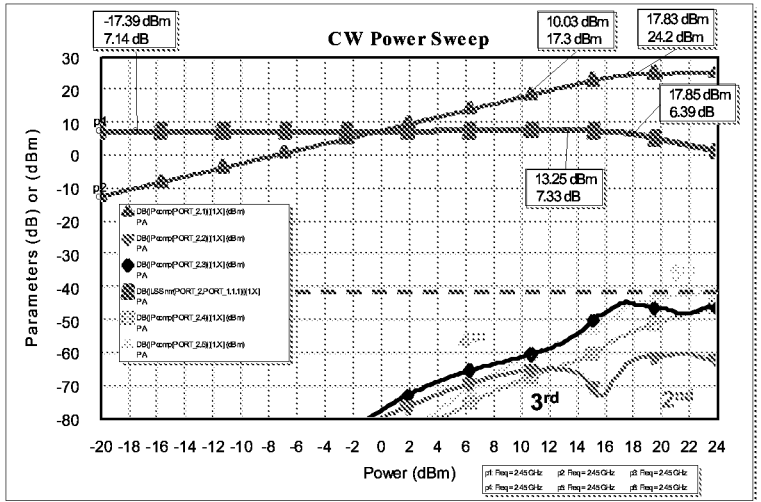
FIGS. 34A, 34B, and 34C are graphs showing the small signal S-parameters of the quasi-differential amplifier circuit shown in FIG. 16 with different base bias inductor variances.
Figure 34B:
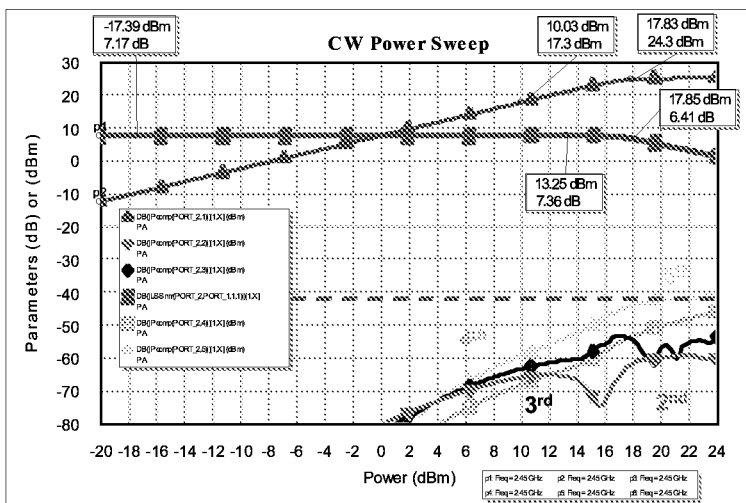
Figure 34C:
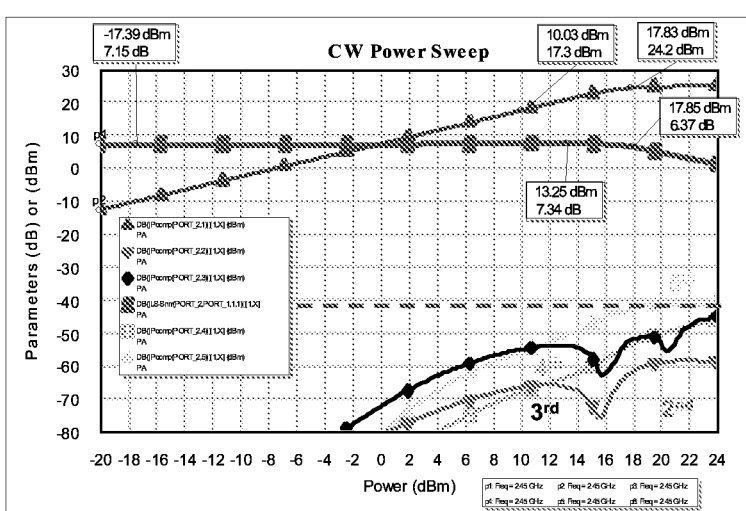

The graphs of FIGS. 34A-34C illustrate harmonics suppression for different base bias inductors variations, with FIG. 34A directed to the first coupled inductor L4-1 with a −10% variation and the second coupled inductor L4-2 with a +10% variation, FIG. 34B directed to a nominal value for both inductors, and FIG. 34C directed to a first coupled inductor L4-1 with a +10% variation and the second coupled inductor L4-2 with a −10% variation. It is understood that with a 20% absolute difference, a maximum total gain variation of 0.03 dB is exhibited, while linearity (P1 dB) remains the same. All harmonics signal components are less than −50 dBm up to an output power of +20 dBm.

Figure 35A:
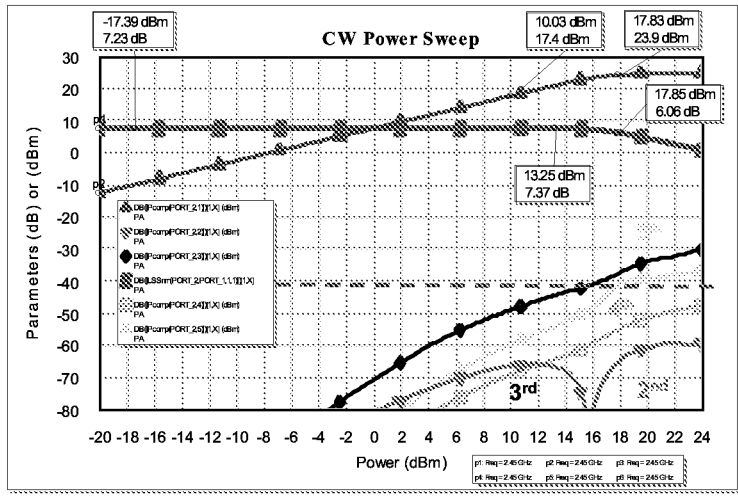
FIGS. 35A, 35B, and 35C are graphs showing the small signal S-parameters of the quasi-differential amplifier circuit shown in FIG. 16 with different collector inductor values.
Figure 35B:
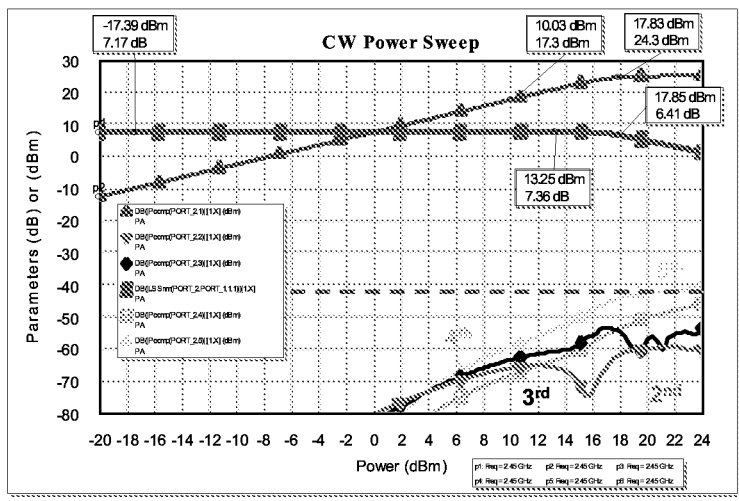
Figure 35C:
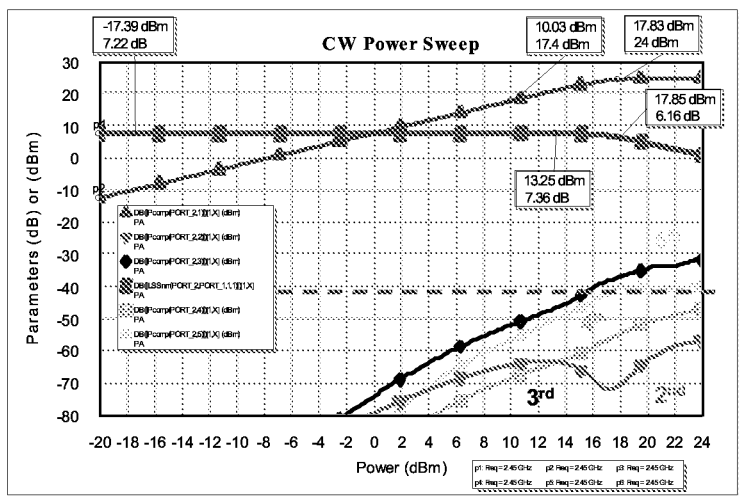

The graphs of FIGS. 35A-35C illustrate harmonics suppression for different collector inductors variations, with FIG. 35A directed to the first collector inductor L2-1 with a 0.3 nH value and the second collector inductor L2-2 with a 0.1 nH value, FIG. 34B directed to 0.1 nH value for both collector inductors, and FIG. 35C directed to a first collector inductor L2-1 with a 0.1 nH value and the second collector inductor L2-2 with a 0.3 nH value. It is understood that with a 0.2 nH increase, a maximum total gain variation of 0.05 dB is exhibited, while linearity (P1 dB) changes by less than 0.3 dB. All harmonics signal components are less than −47 dBm up to an output power of +20 dBm.

Figure 36A:
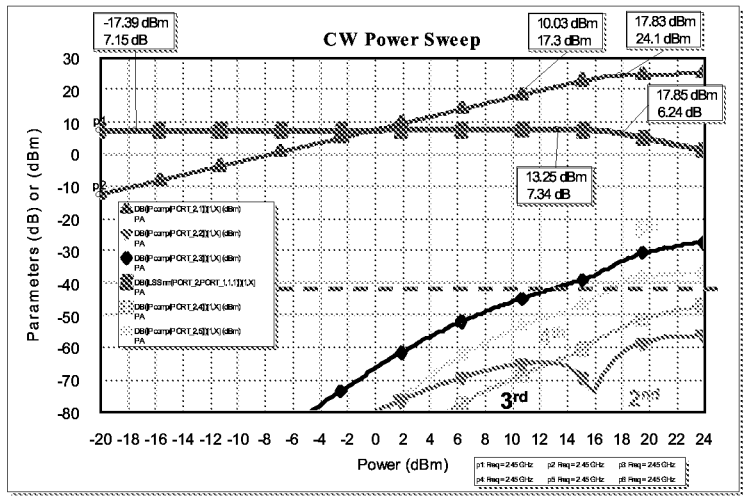
FIGS. 36A, 36C, and 36D are graphs showing the small signal S-parameters of the quasi-differential amplifier circuit shown in FIG. 16 with different base inductor values.
Figure 36B:
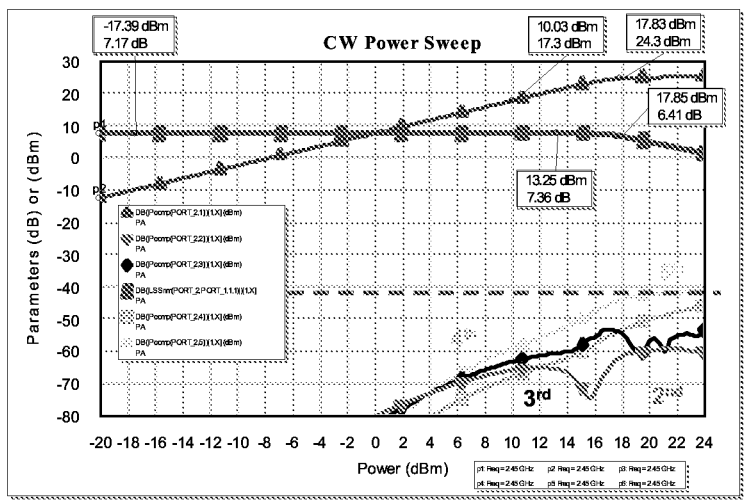
Figure 36C:
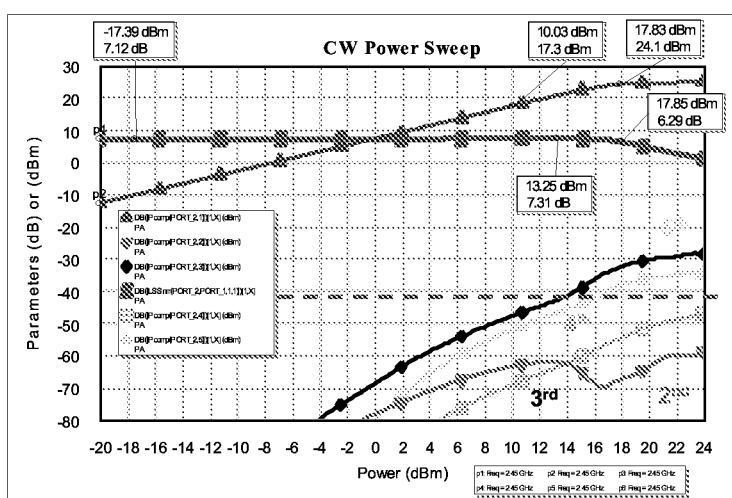

The graphs of FIGS. 36A-35C illustrate harmonics suppression for different base inductors variations, with FIG. 36A directed to the first base inductor L1-1 with a 0.45 nH value and the second base inductor L1-2 with a 0.25 nH value, FIG. 36B directed to 0.25 nH value for both base inductors, and FIG. 36C directed to a first base inductor L1-1 with a 0.25 nH value and the second base inductor L1-2 with a 0.45 nH value. It is understood that with a 0.2 nH increase, a maximum total gain variation of 0.05 dB is exhibited, while linearity (P1 dB) changes by less than 0.1 dB. All harmonics signal components are less than −45 dBm up to an output power of +20 dBm.

Figure 37A:
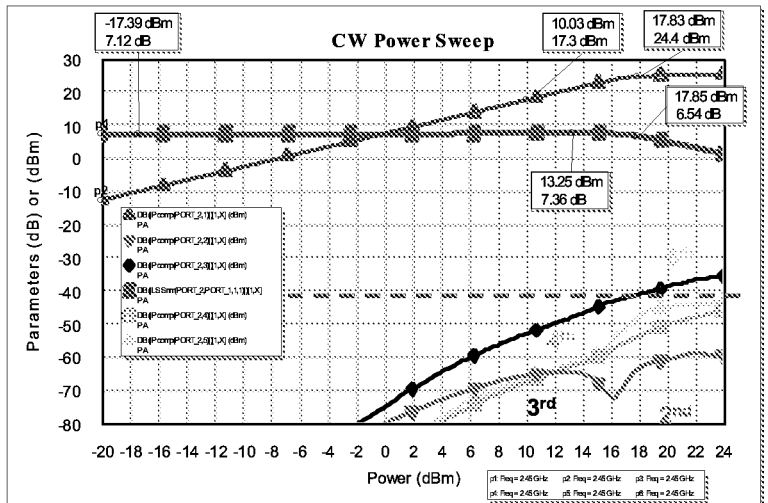
FIGS. 37A, 37B, and 37C are graphs showing the small signal S-parameters of the quasi-differential amplifier circuit shown in FIG. 16 with different balun extension values.
Figure 37B:
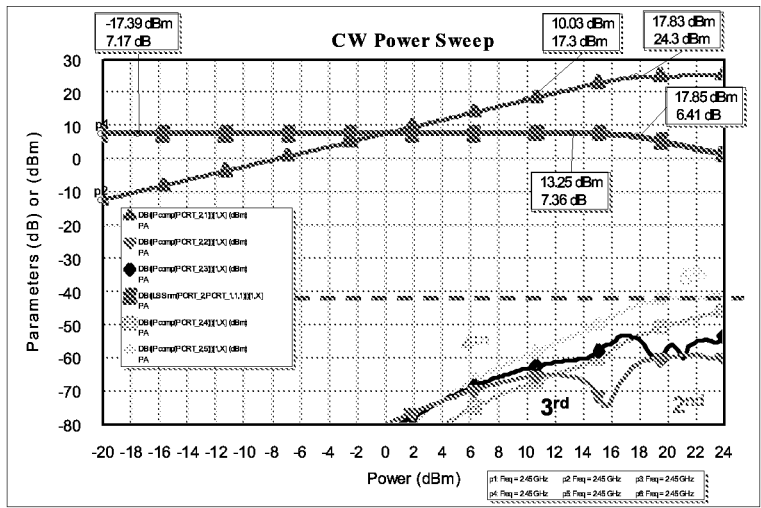
Figure 37C:
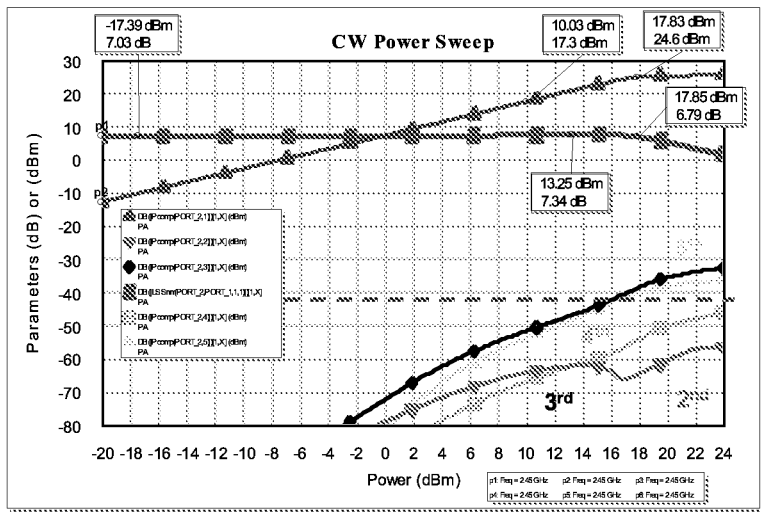

The graphs of FIGS. 37A-37C illustrate harmonics suppression for different balun extension inductor variations, with FIG. 37A directed to the top balun extension inductor with a 0.15 nH value, FIG. 37B directed to a 0 nH value for both balun extension inductors, and FIG. 37C directed to a second balun extension inductor with a 0.15 nH value. It is understood that with a 0.15 nH increase, a maximum total gain variation of 0.1 dB is exhibited, while linearity (P1 dB) changes by less than 0.3 dB. All harmonics signal components are less than −50 dBm up to an output power of +20 dBm.

The circuit 56 is robust to load VSWR variations in a wide range of output signals. For instance, the maximum voltage swing between transistor collector and emitter is increased by less than 20% with the VSWR varying up to a 10:1 ratio.

The particulars shown herein are by way of example and for purposes of illustrative discussion of the embodiments of the balun and quasi-differential amplifier circuits only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A balun circuit comprising:
   a first differential port;
   a second differential port;
   a single-ended port, a differential signal fed to the first differential port and the second differential port being converted to a single signal output from the single-ended port, and a common output impedance of the single-ended port being transformed from an input impedance of the first and second differential ports;
   a pair of first and second coupled inductors, the first coupled inductor being electrically connected to the first differential port and the single-ended port, the second coupled inductor being electrically connected to the second differential port;
   a first capacitor electrically connected to the first coupled inductor at the single-ended port and the second coupled inductor at the second differential port;
   a second capacitor electrically connected to the second coupled inductor; and
   a grounded inductor electrically coupled in series to the second capacitor.

2. The balun circuit of claim 1 wherein phases of voltage components and current components of the differential signal are tuned to a predefined minimum.

3. The balun circuit of claim 2 wherein the predefined minimum is less than five degrees.

4. The balun circuit of claim 1 wherein a total power level delivered to the first and second differential ports are within a predefined percentage of each other.

5. The balun circuit of claim 4 wherein the predefined percentage is less than ten percent.

6. The balun circuit of claim 1 wherein the common output impedance of the single-ended port is ten (10) ohm, the input impedance of the first differential port is seven (7) ohm, and the input impedance of the second differential port is seven (7) ohm.

7. A balun circuit comprising:
a first differential port;
a second differential port;
a single-ended port;
a pair of first and second coupled inductors, the first coupled inductor being connected to the first differential port and to the single-ended port, the second coupled inductor being connected to the second differential port;
a first capacitor connected from the second differential port to the single-ended port;
a second capacitor connected to the second coupled inductor; and
a grounded inductor connected to the second capacitor.

8. The balun circuit of claim 7 wherein a differential signal applied to the first differential port and the second differential port is converted to an output signal from the single-ended port.

9. The balun circuit of claim 8 wherein phases of voltage components and current components of the differential signal are tuned to a predefined minimum.

10. The balun circuit of claim 9 wherein the predefined minimum is less than five degrees.

11. The balun circuit of claim 8 wherein a total power level delivered to the first and second differential ports are within a predefined percentage of each other.

12. The balun circuit of claim 11 wherein the predefined percentage is less than ten percent.

13. The balun circuit of claim 11 wherein a common output impedance of the single-ended port is transformed from an input impedance of the first and second differential ports.

14. The balun circuit of claim 7 wherein the first differential port and the second differential port defines an input impedance different from an output impedance of the single-ended port.

15. The balun circuit of claim 14 wherein a single-ended impedance at a given one of the first differential port, the second differential port, and the single-ended port is different from a single-ended impedance at a different one of the ports.

16. The balun circuit of claim 14 wherein the common output impedance of the single-ended port is ten (10) ohm, the input impedance of the first differential port is seven (7) ohm, and the input impedance of the second differential port is seven (7) ohm.

17. A radio frequency amplifier circuit comprising:
a first amplifier with a first differential output;
a second amplifier with a second differential output;
a single-ended output port;
a pair of first and second coupled inductors, the first coupled inductor being connected to the first differential output of the first amplifier and to the single-ended output port, the second coupled inductor being connected to the second differential output of the second amplifier;
a first capacitor connected from the second differential output to the single-ended output port;
a second capacitor connected to the second coupled inductor; and
a grounded inductor connected to the second capacitor.

18. The radio frequency amplifier circuit of claim 16 further comprising an output matching network connected to the single-ended output port.

19. The radio frequency amplifier circuit of claim 16 wherein a first differential signal fed to the first amplifier and a second differential signal fed to the second amplifier are converted to a single signal output at the single-ended port.

20. The radio frequency amplifier circuit of claim 16 further comprising a phase shifter having a first port, a second port connected to the first amplifier, and a third port connected to the second amplifier.

21. The radio frequency amplifier circuit of claim 20 further comprising a compensation network connected to the second amplifier.

* * * * *